(12) United States Patent
Passamani

(10) Patent No.: US 12,418,298 B2
(45) Date of Patent: Sep. 16, 2025

(54) LOCALIZED IQ MISMATCH MEASUREMENT AND COMPENSATION SYSTEMS AND METHODS

(71) Applicant: Apple Inc., Cupertino, CA (US)

(72) Inventor: Antonio Passamani, Munich (DE)

(73) Assignee: Apple Inc., Cupertino, CA (US)

( * ) Notice: Subject to any disclaimer, the term of this patent is extended or adjusted under 35 U.S.C. 154(b) by 172 days.

(21) Appl. No.: 18/108,232

(22) Filed: Feb. 10, 2023

(65) Prior Publication Data
US 2024/0275394 A1 Aug. 15, 2024

(51) Int. Cl.
*H03M 1/66* (2006.01)
*H03M 1/06* (2006.01)

(52) U.S. Cl.
CPC ..................... *H03M 1/06* (2013.01)

(58) Field of Classification Search
CPC ......... H03L 7/085; H03L 7/093; H03L 7/081; H03L 7/087; H03L 7/1976; H03L 7/099; H03L 7/0992; H03L 2207/50; H03L 7/18; H03L 7/08; H03L 7/091; H03L 7/0991; H03L 7/0814; H03L 7/0818; H03L 7/0995; H03L 7/1974; H03L 2207/06; H03L 7/0812; H03L 7/083; H03L 7/0891; H03L 7/23; H03L 7/07; H03L 7/0802; H03L 7/189; H03L 7/195; H03L 7/197;
(Continued)

(56) References Cited

U.S. PATENT DOCUMENTS 5,923,715 A * 7/1999 Ono .................. H03L 7/0997
331/25
5,946,268 A * 8/1999 Iwamoto ............. H03K 5/133
365/194

(Continued)

FOREIGN PATENT DOCUMENTS

EP 2773045 A1 9/2014

OTHER PUBLICATIONS

S. Reekmans, J. De Maeyer, P. Rombouts and L. Weyten, "Quadrature Mismatch Shaping for Digital-to-Analog Converters," in IEEE Transactions on Circuits and Systems I: Regular Papers, vol. 53, No. 12, pp. 2529-2538, Dec. 2006, doi: 10.1109/TCSI.2006.883842.

*Primary Examiner* — Linh V Nguyen
(74) *Attorney, Agent, or Firm* — FLETCHER YODER PC

(57) ABSTRACT

The present disclosure relates to quadrature (IQ) signal mismatch in RFDACs. IQ mismatch is a non-ideality which occurs whenever I and Q vectors deployed to modulate the phase and the amplitude of RFDAC output signals are not aligned to be offset 90 degrees between each other. IQ mismatch may result in EVM degradation, and may be especially problematic for the RFDAC architecture because the RFDAC operates its digital-to-analog conversion at RF rate. A system may be deployed in the RFDAC to measure and compensate for IQ mismatch. The system may enable full-CMOS digital integration of both the measurement and compensation procedures. The system uses a simple flip-flop structure and exploits the fact that phase-vectors in CMOS logic are eventually digital pulses, and as such the mismatch (Continued)

between I and Q pulses with identical rise-fall time is simply measured as a skewed rise-to-rise and fall-to-fall delay between phases.

20 Claims, 13 Drawing Sheets

(58) Field of Classification Search
CPC ......... H03L 7/00; H03L 7/0805; H03L 7/089;
H03L 7/0994; H03L 7/102; H03L 7/103;
H03L 7/1075; H03L 7/113; H03L 7/183;
H03L 7/193; H03L 7/22; H03L 7/24;
H03M 1/1014; H03M 1/82; H03M 3/50;
H03M 1/00; H03M 1/0641; H03M
1/0695; H03M 1/0836; H03M 1/0854;
H03M 1/1033; H03M 1/12; H03M 1/125;
H03M 1/145; H03M 1/16; H03M 1/201;
H03M 1/462; H03M 1/50; H03M 1/502;
H03M 1/504; H03M 1/52; H03M 1/66;
H03M 1/802; H03M 1/825; H03M 3/344;
H03M 3/358; H03M 3/368; H03M 3/378;
H03M 3/424; H03M 3/43; H03M 3/454;
H03M 7/3004; H03M 7/3015
USPC .................. 341/118–121, 141, 144, 150
See application file for complete search history.

(56) References Cited

U.S. PATENT DOCUMENTS

| | | | |
|---|---|---|---|
| 7,205,924 B2 * | 4/2007 | Vemulapalli | H04L 27/361 341/166 |
| 8,094,054 B2 | 1/2012 | Helfenstein | |
| 8,222,966 B2 * | 7/2012 | Ravi | H03C 3/10 375/302 |
| 8,526,533 B2 | 9/2013 | Sen | |
| 8,731,106 B1 | 5/2014 | Wolf | |
| 8,854,098 B2 | 10/2014 | Yang | |
| 8,982,993 B2 | 3/2015 | Chang | |
| 9,118,512 B2 | 8/2015 | Gotman | |
| 9,281,907 B2 | 3/2016 | An | |
| 9,746,832 B1 * | 8/2017 | Yao | H03M 1/50 |
| 10,177,774 B2 * | 1/2019 | Palaskas | H03M 1/466 |
| 11,088,691 B2 * | 8/2021 | Yabe | H03K 3/014 |
| 11,356,112 B1 * | 6/2022 | Quintero Alonso | H03M 1/145 |
| 2008/0180154 A1 * | 7/2008 | Brannen | H03K 5/133 327/276 |
| 2015/0162934 A1 * | 6/2015 | Kim | H03M 1/661 341/110 |
| 2016/0056827 A1 * | 2/2016 | Vlachogiannakis | G04F 10/005 327/158 |
| 2024/0171165 A1 * | 5/2024 | Elmallah | H03K 5/1252 |

* cited by examiner

LOCALIZED IQ MISMATCH MEASUREMENT AND COMPENSATION SYSTEMS AND METHODS

BACKGROUND

The present disclosure relates generally to pass devices and digital-to-analog converters (DACs).

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure.

Numerous electronic devices—including televisions, portable phones, computers, wearable devices, vehicle dashboards, virtual-reality glasses, and more utilize—DACs to generate analog electrical signals from digitally coded data. For example, an electronic device may use one or more DACs to convert digital signals to analog signals for transmission via radio frequency (RF) circuitry. Additionally or alternatively, DACs may be used to drive pixels of an electronic display at specific voltages based on digitally coded image data to produce the specific luminance level outputs to display an image. In some scenarios, DACs may use quadrature signals (e.g., I and Q) for control and/or modulation, such as in the phase and/or amplitude modulation of RF transceiver signals generated by a DAC. However, IQ mismatch is a non-ideality that occurs whenever quadrature (I and Q) vectors deployed to modulate the phase and/or the amplitude of radio-frequency digital-to-analog converter (RFDAC) output signals are not aligned in a desired way (e.g., having a phase relationship other than 90 degrees). In some scenarios, IQ mismatch may affect error vector magnitude (EVM) performance of the RFDAC and reduce overall RFDAC performance.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a digital-to-analog converter includes a delay line that includes a plurality of inverters selectively coupled to an output of the delay line via a first plurality of switches; an additive delay line that includes a second plurality of switches coupled to a plurality of capacitive elements, wherein the additive delay line is coupled between a first inverter and a second inverter of the plurality of inverters; and a latch sensor that includes an input coupled to the output of the delay line.

In another embodiment, a system includes a delay line configured to receive a reference signal and apply one or more delays to the reference signal; a sensor coupled to an output of the delay line, the sensor configured to receive a first quadrature signal, and receive a second quadrature signal, and processing circuitry configured to determine a phase offset between the second quadrature signal based on a first overlap between the first quadrature signal and the second quadrature signal.

In yet another embodiment, a method includes determining, via a processor, a mismatch between a first phase of a first quadrature signal and a second phase of a second quadrature signal, applying, via the processor, a compensation to the first quadrature signal, the second quadrature signal, or both; determining, via the processor, an error in the compensation; and adjusting, via the processor, the compensation to mitigate the error.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings described below in which like numerals refer to like parts.

DETAILED DESCRIPTION OF SPECIFIC EMBODIMENTS

Figure 1:
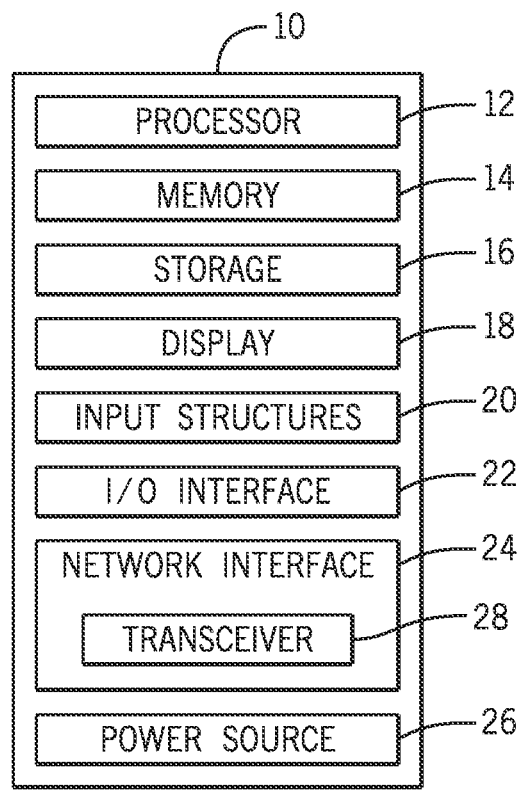
FIG. 1 is a block diagram of an electronic device, according to embodiments of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the particular features, structures, or characteristics may be combined in any suitable manner in one or more embodiments. Use of the terms "approximately," "near," "about," "close to," and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on). Moreover, it should be understood that any exact values, numbers, measurements, and so on, provided herein, are contemplated to include approximations (e.g., within a margin of suitable or contemplatable error) of the exact values, numbers, measurements, and so on.

The present disclosure relates to digital-to-analog conversion. In particular, the present disclosure relates to measuring and mitigating quadrature (IQ) signal mismatch in digital-to-analog converters (DACs) (e.g., having a column-and-line or fractal layout) such as those used in radio frequency (RF) communications (e.g., cellular communications). IQ mismatch is a non-ideality that occurs whenever the I and Q vectors (e.g., deployed to modulate the phase and the amplitude of RFDAC output signals) are not aligned as desired (e.g., offset by other than 90 degrees from each other). In general, quadrature (IQ) signal mismatch non-ideality may affect performance characteristics of the RFDAC IQ architecture when transmitting a modulated signal. For example, IQ mismatch may result in error vector magnitude (EVM) degradation, which may be exasperated at higher frequencies, and may be further exasperated in cases where the RFDAC performs digital-to-analog conversions at the RF rate associated with the IQ signals. As should be appreciated although discussed herein in the context of RFDACs, the techniques discussed herein may be utilized to measure and/or compensate for IQ mismatch in any electronic device that utilizes quadrature signals.

As discussed herein, a system may be deployed in the RFDAC to measure and compensate for IQ mismatch. In some embodiments, the system may be implemented via CMOS digital integration for the measurement and/or compensation procedures. For example, the system may use a latch (e.g., flip-flop) circuit and exploit the fact that phase-vectors in CMOS logic are may be measured as digital pulses. As such the mismatch between I and Q pulses may be measured as a skewed rise-to-rise and fall-to-fall delay (e.g., in, milliseconds (ms), microseconds (μs), picoseconds (ps), etc.) between phases.

With the foregoing in mind, FIG. 1 is a block diagram of an electronic device 10, according to embodiments of the present disclosure. The electronic device 10 may include, among other things, one or more processors 12 (collectively referred to herein as a single processor for convenience, which may be implemented in any suitable form of processing circuitry), memory 14, nonvolatile storage 16, a display 18, input structures 20, an input/output (I/O) interface 22, a network interface 24, and a power source 26. The various functional blocks shown in FIG. 1 may include hardware elements (including circuitry), software elements (including machine-executable instructions) or a combination of both hardware and software elements (which may be referred to as logic). The processor 12, memory 14, the nonvolatile storage 16, the display 18, the input structures 20, the input/output (I/O) interface 22, the network interface 24, and/or the power source 26 may each be communicatively coupled directly or indirectly (e.g., through or via another component, a communication bus, a network) to one another to transmit and/or receive data between one another. It should be noted that FIG. 1 is merely one example of a particular implementation and is intended to illustrate the types of components that may be present in electronic device 10.

By way of example, the electronic device 10 may include any suitable computing device, including a desktop or notebook computer, a portable electronic or handheld electronic device such as a wireless electronic device or smartphone, a tablet, a wearable electronic device, and other similar devices. In additional or alternative embodiments, the electronic device 10 may include an access point, such as a base station, a router (e.g., a wireless or Wi-Fi router), a hub, a switch, and so on. It should be noted that the processor 12 and other related items in FIG. 1 may be generally referred to herein as "data processing circuitry." Such data processing circuitry may be embodied wholly or in part as software, hardware, or both. Furthermore, the processor 12 and other related items in FIG. 1 may be a single contained processing module or may be incorporated wholly or partially within any of the other elements within the electronic device 10. The processor 12 may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that may perform calculations or other manipulations of information. The processors 12 may include one or more application processors, one or more baseband processors, or both, and perform the various functions described herein.

In the electronic device 10 of FIG. 1, the processor 12 may be operably coupled with a memory 14 and a nonvolatile storage 16 to perform various algorithms. Such programs or instructions executed by the processor 12 may be stored in any suitable article of manufacture that includes one or more tangible, computer-readable media. The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor 12 to enable the electronic device 10 to provide various functionalities.

In certain embodiments, the display 18 may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more liquid crystal displays (LCDs), light-emitting diode (LED) displays, organic light-emitting diode (OLED) displays, active-matrix organic light-emitting diode (AMOLED) displays, or some combination of these and/or other display technologies.

The input structures 20 of the electronic device 10 may enable a user to interact with the electronic device 10 (e.g., pressing a button to increase or decrease a volume level). The I/O interface 22 may enable electronic device 10 to interface with various other electronic devices, as may the network interface 24. In some embodiments, the I/O interface 22 may include an I/O port for a hardwired connection for charging and/or content manipulation using a standard connector and protocol, such as the Lightning connector provided by Apple Inc. of Cupertino, California, a universal serial bus (USB), or other similar connector and protocol. The network interface 24 may include, for example, one or more interfaces for a personal area network (PAN), such as an ultra-wideband (UWB) or a BLUETOOTH® network, for a local area network (LAN) or wireless local area network (WLAN), such as a network employing one of the IEEE 522.11x family of protocols (e.g., WI-FI®), and/or for a wide area network (WAN), such as any standards related to the Third Generation Partnership Project (3GPP), including, for example, a 3rd generation (3G) cellular network, universal mobile telecommunication system (UMTS), 4th generation (4G) cellular network, long term evolution (LTE®) cellular network, long term evolution license assisted access (LTE-LAA) cellular network, 5th generation (5G) cellular network, and/or New Radio (NR) cellular network, a satellite network, and so on. In particular, the network interface 24 may include, for example, one or more interfaces for using a Release-15 cellular communication standard of the 5G specifications that include the millimeter wave (mmWave) frequency range (e.g., 22.25-300 gigahertz (GHz)) and/or any other cellular communication standard release (e.g., Release-16, Release-17, any future releases) that define and/or enable frequency ranges used for wireless communication. The network interface 24 of the electronic device 10 may allow communication over the aforementioned networks (e.g., 5G, Wi-Fi, LTE-LAA, and so forth).

The network interface 24 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

As illustrated, the network interface 24 may include a transceiver 28. In some embodiments, all or portions of the transceiver 28 may be disposed within the processor 12. The transceiver 28 may support transmission and receipt of various wireless signals via one or more antennas, and thus may include a transmitter and a receiver. The power source 26 of the electronic device 10 may include any suitable source of power, such as a rechargeable lithium polymer (Li-poly) battery and/or an alternating current (AC) power converter. In certain embodiments, the electronic device 10 may take the form of a computer, a portable electronic device, a wearable electronic device, or other type of electronic device.

Figure 2:
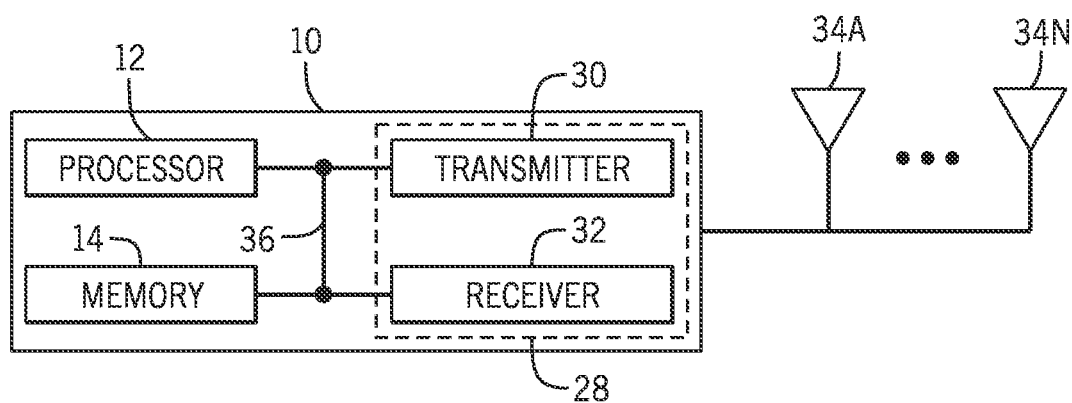
FIG. 2 is a schematic diagram of the electronic device of FIG. 1, according to embodiments of the present disclosure.

FIG. 2 is a functional diagram of the electronic device 10 of FIG. 1, according to embodiments of the present disclosure. As illustrated, the processor 12, the memory 14, the transceiver 28, a transmitter 30, a receiver 32, and/or antennas 34 (illustrated as 34A-34N, collectively referred to as an antenna 34) may be communicatively coupled directly or indirectly (e.g., through or via another component, a communication bus, a network) to one another to transmit and/or receive data between one another.

The electronic device 10 may include the transmitter 30 and/or the receiver 32 that respectively enable transmission and reception of data between the electronic device 10 and an external device via, for example, a network (e.g., including base stations) or a direct connection. As illustrated, the transmitter 30 and the receiver 32 may be combined into the transceiver 28. The electronic device 10 may also have one or more antennas 34A-34N electrically coupled to the transceiver 28. The antennas 34A-34N may be configured in an omnidirectional or directional configuration, in a single-beam, dual-beam, or multi-beam arrangement, and so on. Each antenna 34 may be associated with one or more beams and various configurations. In some embodiments, multiple antennas of the antennas 34A-34N of an antenna group or module may be communicatively coupled to a respective transceiver 28 and each emit radio frequency signals that may constructively and/or destructively combine to form a beam. The electronic device 10 may include multiple transmitters, multiple receivers, multiple transceivers, and/or multiple antennas as suitable for various communication standards. In some embodiments, the transmitter 30 and the receiver 32 may transmit and receive information via other wired or wireline systems or means.

As illustrated, the various components of the electronic device 10 may be coupled together by a bus system 36. The bus system 36 may include a data bus, for example, as well as a power bus, a control signal bus, and a status signal bus, in addition to the data bus. The components of the electronic device 10 may be coupled together or accept or provide inputs to each other using some other mechanism.

Figure 3:
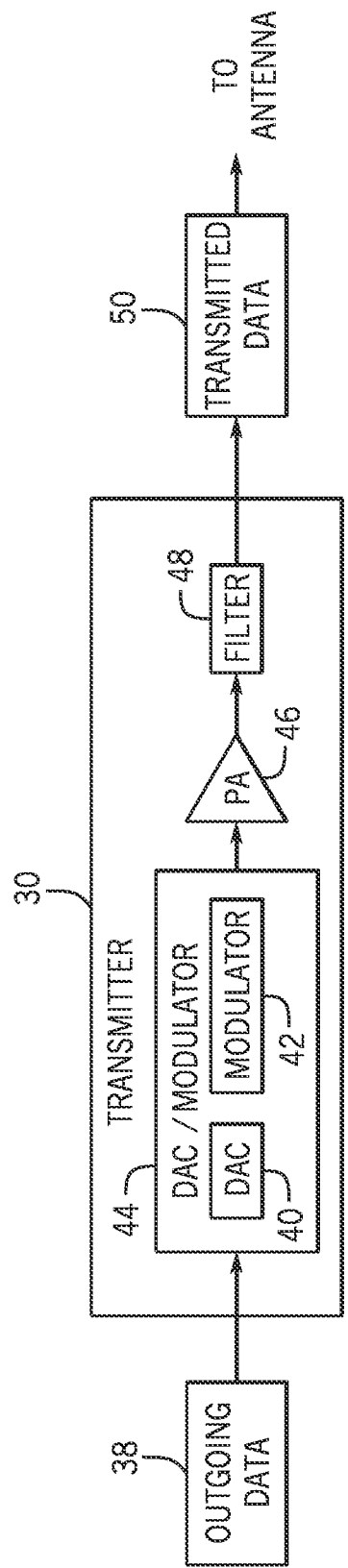
FIG. 3 is a schematic diagram of a transmitter of the electronic device of FIG. 1, according to embodiments of the present disclosure.

FIG. 3 is a schematic diagram of the transmitter 30 (e.g., transmit circuitry), according to embodiments of the present disclosure. As illustrated, the transmitter 30 may receive outgoing data 38 in the form of a digital signal to be transmitted via the one or more antennas 34. A digital-to-analog converter (DAC) 40 of the transmitter 30 may convert the digital signal to an analog signal, and a modulator 42 may combine the converted analog signal with a carrier signal to generate a radio wave. Additionally or alternatively, the DAC 40 and modulator 42 may be implemented together in a DAC/modulator 44. For example, the DAC/modulator 44 may convert the digital signal to the analog signal and combine the converted analog signal with the carrier signal simultaneously or concurrently and/or within the same circuitry. Moreover, the DAC/modulator 44 may be implemented as multiple circuits (e.g., DAC 40 and modulator 42) coupled together or a singular combined circuit. In some embodiments, the DAC/modulator 44 may directly generate a modulated analog signal without first generating the converted analog signal. Furthermore, as used herein, a DAC 40 may refer to a standalone DAC 40 or a combined DAC/modulator 44, and an analog signal may refer to a converted analog signal or a modulated analog signal. Additionally, while embodiments are described herein as applying to RF signal generation, in some embodiments, aspects of the present disclosure may be applicable to other types or utilizations of DACs, such as a baseband DAC.

A power amplifier (PA) 46 receives the modulated signal from the modulator 42. The power amplifier 46 may amplify the modulated signal to a suitable level to drive transmission of the signal via the one or more antennas 34. A filter 48 (e.g., filter circuitry and/or software) of the transmitter 30 may then remove undesirable noise from the amplified signal to generate transmitted data 50 to be transmitted via the one or more antennas 34. The filter 48 may include any suitable filter or filters to remove the undesirable noise from the amplified signal, such as a bandpass filter, a bandstop filter, a low pass filter, a high pass filter, and/or a decimation filter. Additionally, the transmitter 30 may include any suitable additional components not shown, or may not include certain of the illustrated components, such that the transmitter 30 may transmit the outgoing data 38 via the one or more antennas 34. For example, the transmitter 30 may include a mixer and/or a digital up converter. As another example, the transmitter 30 may not include the filter 48 if the power amplifier 46 outputs the amplified signal in or approximately in a desired frequency range (such that filtering of the amplified signal may be unnecessary).

Figure 4:
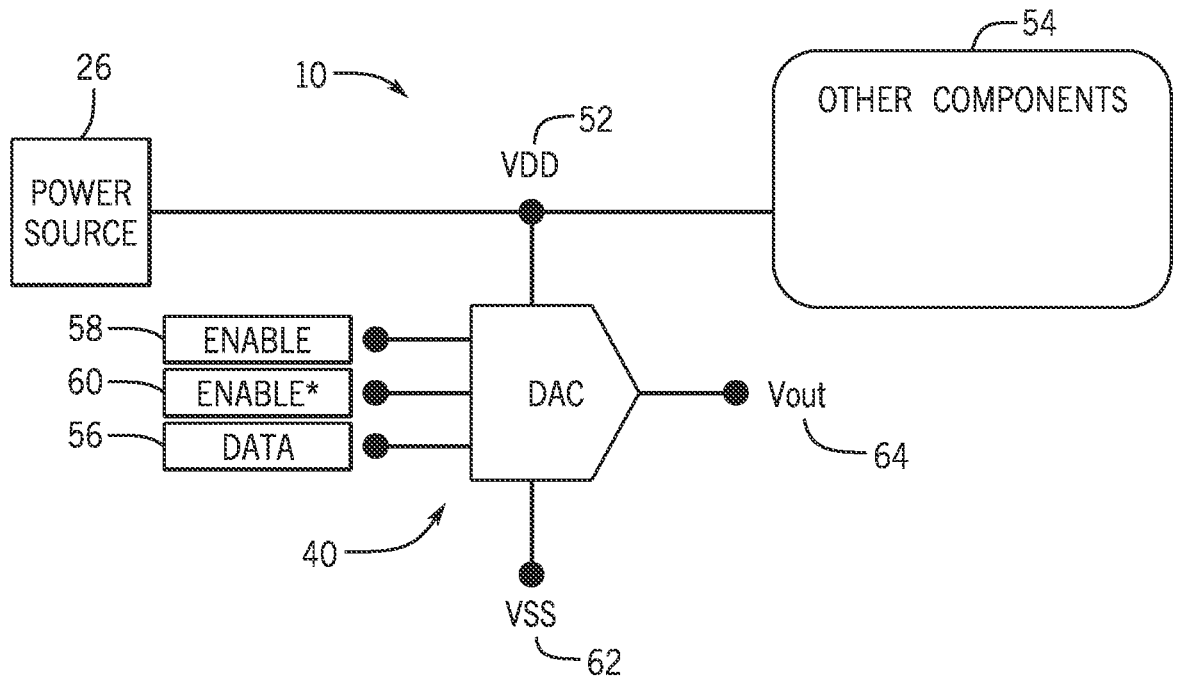
FIG. 4 is a schematic diagram of a portion of the electronic device of FIG. 1 including a digital-to-analog converter (DAC) of the transmitter of FIG. 3, in accordance with an embodiment of the present disclosure.

FIG. 4 is a schematic diagram of a portion of the transmitter 30 of the electronic device 10 having a DAC 40, according to an embodiment of the present disclosure. In some embodiments, the DAC 40 may share a supply or positive power voltage (e.g., VDD) 52 provided by the power source 26 with other components 54 of the transmitter 30 and/or the electronic device 10. For example, the other components 54 may include any powered electronic component of the transmitter 30 and/or the electronic device 10 utilizing the supply voltage 52 or a derivative thereof. Moreover, the DAC 40 may receive a digital signal 56 (e.g., of outgoing data 38), an enable signal 58, and/or a complementary enable signal 60. The enable signal 58 and/or the complementary enable signal 60 may enable and/or facilitate enabling operation of the DAC 40. For example, if the enable signal 58 is logically "low" relative to a reference voltage 62 (e.g., ground or other relative voltage), then the DAC 40 may be disabled or inactive (e.g., in a disable, inactive, or deactivated state). On the other hand, if the enable signal 58 is logically "high" (e.g., relative to the reference voltage 62 and/or the supply voltage 52), then the DAC 40 may be enabled or active for operation (e.g., in an enabled or activated state). Furthermore, the reference voltage 62 (e.g., VSS) may be provided as a reference for the digital signal 56, the enable signal 58, the complementary enable signal 60, the supply voltage 52, and/or the analog output signal 64. As should be appreciated, and as used herein, signals (e.g., the digital signal 56, the enable signal 58, the complementary enable signal 60, the analog output signal 64, etc.) may correspond to voltages and/or currents relative to a reference and may represent electronically storable, displayable, and/or transmittable data.

As discussed herein, the different analog output signals 64 generated by the DAC 40 may correspond to values of the digital signal 56. The digital signal 56 and corresponding analog output signal 64 may be associated with any suitable bit-depth depending on implementation. For example, in the context of image data (e.g., in a baseband DAC) and/or signal transmission data (e.g., in an RF DAC), an 8-bit digital signal 56 may correspond to 255 or 256 analog output signals 64.

Figure 5:
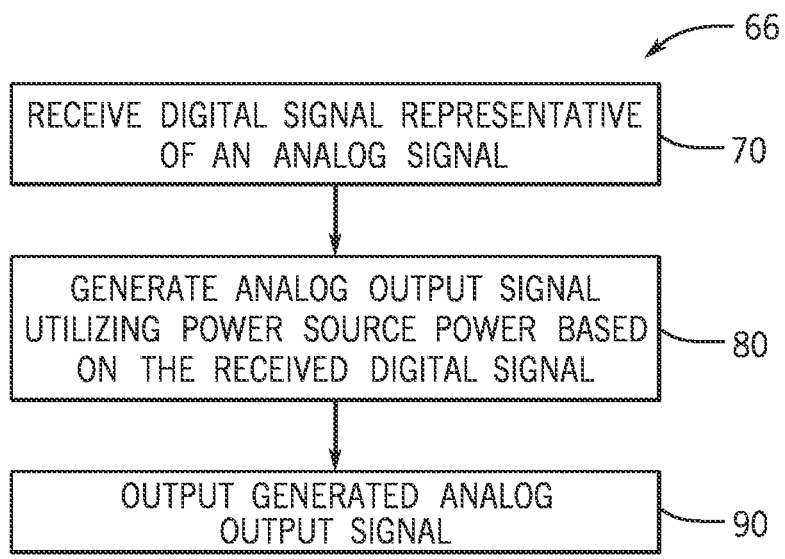
FIG. 5 is a flowchart of a method for converting a digital signal to an analog signal using the DAC of FIG. 4, in accordance with an embodiment of the present disclosure.

FIG. 5 is a flowchart of a method 66 for converting a digital signal to an analog signal using the DAC 40, according to an embodiment of the present disclosure. In general, the DAC 40 may receive a digital signal 56 representative of an analog signal (process block 70). The DAC 40 may also generate an analog output signal 64 (as discussed in further detail below), utilizing power from the power source 26, based on the received digital signal 56 (process block 80). The generated analog output signal 64 may then be output from the DAC 40 (processing block 90).

Figure 6:
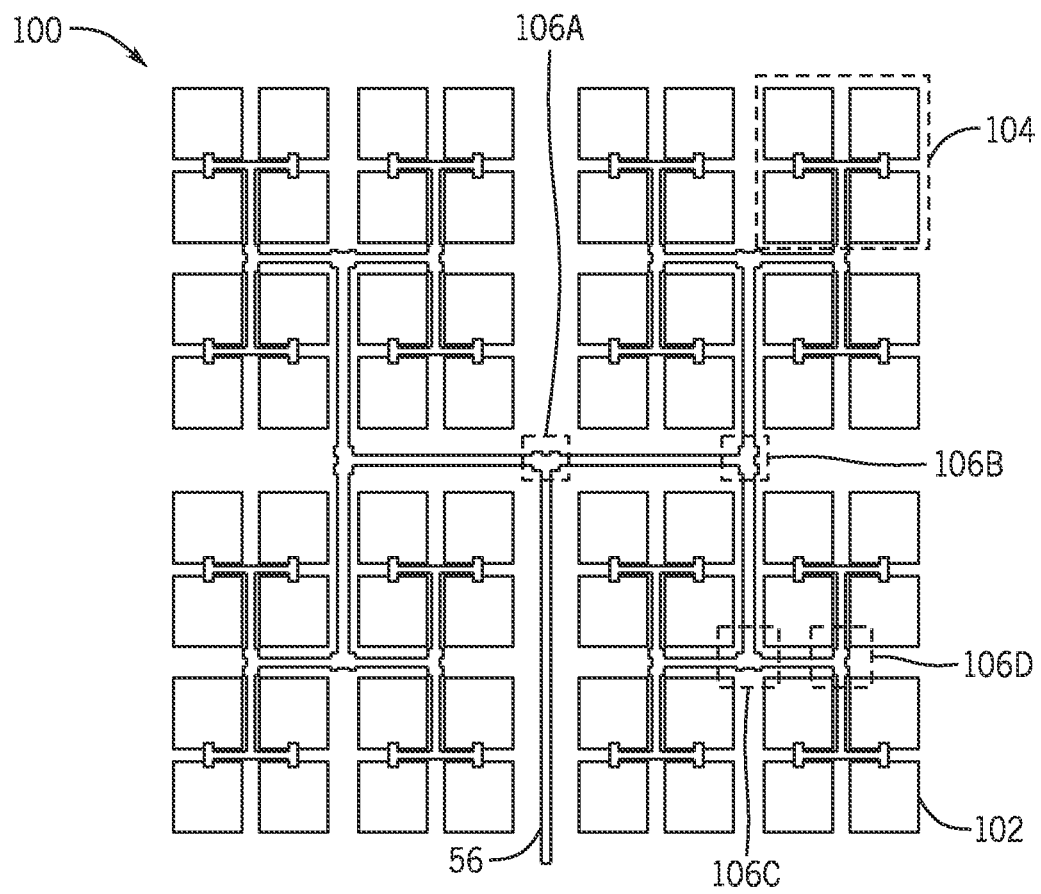
FIG. 6 is a schematic diagram of a fractal DAC, in accordance with an embodiment of the present disclosure.

As discussed above, the DAC 40 may generate an analog output signal 64 by enabling one or more unit cells to output a unit amount of current or voltage that, in the aggregate, form the analog output signal 64. The unit current or voltage may be predetermined and based on implementation factors. For example, the unit cells may include one or more capacitors that store a fixed amount of charge that may be released to form the analog output signal 64. In some scenarios, the physical and/or logical layout of the unit cells may affect the speed of operation of the DAC 40 and/or the linearity of the DAC 40. As such, in some embodiments, one or more DACs 40 of the electronic device 10 may be implemented as a fractal DAC 100, as illustrated in FIG. 6. A fractal DAC 100 may include multiple unit cells 102 arranged (e.g., logically and/or physically) in a fractal pattern constructed of fractal blocks 104. Moreover, the illustrated pattern may be replicated by replacing each unit cell 102 with a fractal block 104 to realize a fractal DAC of increased size while maintaining symmetry.

In the illustrated example, the fractal DAC 100 includes sixteen fractal blocks 104 of four unit cells 102, which may correspond to, for example, sixty-four different analog output signals 64 (e.g., which may have non-zero values). However, larger fractal DACs may be envisioned by replacing each unit cell 102 with a fractal block 104, increasing the size of the fractal DAC 100 by four each time to maintain 4x unit cells 102 (where x is the number of fractal block recursions in the fractal DAC 100). As should be appreciated, the size of the fractal DAC 100 may depend on implementation factors such as desired granularity of the analog output signal 64. Furthermore, different size fractal blocks 104 (e.g., half of a fractal block 104) may be used to achieve different numbers of total unit cells 102 (e.g., 2x number of unit cells 102 for fractal blocks 104 having a size of two unit cells 102). Moreover, in some embodiments, one or more unit cells 102 may be representative of fractional unit cells (e.g., outputting 0.5 or 0.25 of a unit voltage or current) to further increase granularity, dynamic range extension, and/or as an offset to decrease differential non-linearity (DNL) and/or integral nonlinearity (INL).

In some embodiments, the multiple nested fractal blocks 104 may be continuously/recursively split into symmetrical branches by decision units 106 (e.g., 106A, 106B, 106C, 106D, etc.) until reaching the unit cells 102. That is, for a given branch of the fractal DAC 100, sequential decision units 106 may be used to interpret and decode the digital signal 56 and direct enable/disable signals to the corresponding unit cells 102 to generate the analog output signal 64. Additionally, although the digital signal 56 is depicted as a single line, in some embodiments, the digital signal 56 may include multiple data buses running in parallel through the fractal DAC 100. For example, the multiple data buses may include data for multiple phases and/or polarity (e.g., negative and positive). As such, the fractal DAC 100 and the decision units 106 may operate using multiple digital signals 56 in parallel to control outputs of the unit cells 102.

Figure 7:
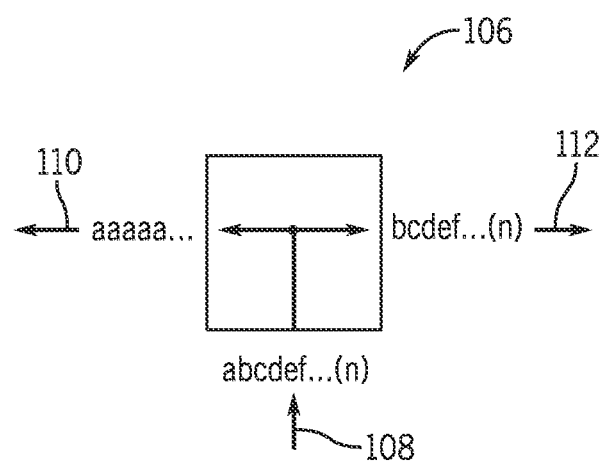
FIG. 7 is a schematic diagram of a decision unit of the fractal DAC of FIG. 6, in accordance with an embodiment of the present disclosure.

To help illustrate, FIG. 7 is an example decision unit 106 receiving an incoming signal 108 of n bits, according to an embodiment of the present disclosure. In some embodiments, the incoming signal 108 (e.g., the digital signal 56) is a binary signal that is decoded step-by-step by the sequential decision units 106, such that the aggregate of the signals reaching the unit cells 102 forms a thermometric signal. For example, the aggregate thermometric signal for a binary incoming signal 108 of "10" may be represented as "0011." As the decision units 106 decipher and pass on certain portions of the incoming signal 108 along different routes, the unit cells 102 may eventually end up with respective portions of the thermometric digital signal (e.g., with logical "1" or high going to two unit cells 102 for activation and logical "0" or low going to two different unit cells 102 for deactivation). For example, the incoming signal 108 may have n-bits (e.g., abcdef . . . n, where each letter is representative of a logical value in a binary format, as in the illustrated example). Each decision unit 106 may take the most significant bit (MSb) of the incoming signal 108, repeat it n−1 times, and output a MSb signal 110 having the MSb of the incoming signal 108 repeated n−1 times. Additionally, the decision unit 106 may output a least significant bit (LSb) signal 112 including the remainder of the incoming signal 108, without the MSb, having n−1 total bits.

As should be appreciated, the MSb of a binary signal is representative of half of the value of the incoming signal 108. As such, if the MSb (e.g., at decision unit 106A) is a logical "1", the repeated logical "1" will be propagated down half of the branches of the fractal DAC 100, reducing the bit-depth by one with each subsequent decision unit 106, to enable half of the unit cells 102 downstream from the initial decision unit 106 (e.g., decision unit 106A). The remaining half of the unit cells 102 may be enabled or disabled according to the LSb signal 112 having the remainder of the incoming signal 108. Using similar logic, the LSb signal 112 from an initial decision unit 106 (e.g., decision unit 106A) may be the incoming signal 108 for a subsequent decision unit 106 (e.g., decision unit 106B) and so forth. Furthermore, while depicted as outputting the MSb signal 110 to the left and the LSb signal 112 to the right, decision units 106 may output the LSb signal 112 and MSb signal 110 in either direction according to a fill order (e.g., an order of increasing activations of unit cells 102) of the fractal DAC 100, which may be programmable. Moreover, in some embodiments, a remainder bit may be added to the digital signal 56 prior to the fractal DAC 100 or added to the MSb signal 110 and/or LSb signal 112 at the first decision unit 106 (e.g., decision unit 106A) based on the digital signal 56 to facilitate decoding from a binary digital signal to a thermometric digital signal (e.g., at the unit cells 102).

Additionally, although depicted in FIGS. 6 and 7 as having two outputs (e.g., MSb signal 110 and LSb signal 112), in some embodiments, the decision units 106 may evaluate multiple bits of the incoming signal 108 at the same time (e.g., simultaneously or concurrently). For example, a decision unit 106 may provide four outputs in a quaternary split of the incoming signal 108, effectively combining the efforts of the first two levels of decision units 106 (e.g., decision unit 106A, decision unit 106B, and the decision unit opposite decision unit 106B). In the example of the quaternary split, two outputs may include the MSb signal 110 with a bit depth of n−2, a signal of repeated entries of the second MSb with a bit depth of n−2, and the LSb signal 112 with a bit depth of n−2, having the 2 MSbs removed. As should be appreciated, the number of splits for a single decision unit 106 may vary based on implementation. Furthermore, in some embodiments, the decision units 106 may include multiple incoming signals 108, for example from multiple parallel data buses, and provide either a binary split, a quaternary split, or other split to each incoming signal 108.

As discussed above, the fractal DAC 100 may facilitate decoding of the digital signal 56 (e.g., via the decision units 106) into a thermometric signal dispersed among the unit cells 102. Additionally or alternatively, the digital signal 56 may include a binary signal that is not decoded via the decision units 106. For example, some unit cells 102 may have a binary-sized output that is dependent upon a binary signal. In some embodiments, the binary signal (e.g., a portion of or separate from the digital signal 56) may traverse the same path as the decoded thermometric signal and therefore have substantially similar arrival time at the binary coded unit cells 102, maintaining synchronicity of the fractal DAC 100. For example, the binary signal may be passed through or bypass the decision units 106 and/or use separate distribution logic following the data path of the fractal DAC 100. The binary coded unit cells 102 may use the binary signal to vary the output between zero (e.g., disabled) and a full unit voltage or current (e.g., 0.0, 0.25, 0.5, 0.75, or 1.0 of a unit voltage or current). For example, the binary coded unit cell 102 may include binary interpretation logic to decode the binary signal and enable the binary coded unit cell 102 at an intermediate power level (e.g., 0.25, 0.5, or 0.75 of a unit voltage or current). The binary-sized output of the binary coded unit cells 102 may facilitate increasing resolution of the analog output signal 64 by providing increased granularity.

Figure 8:
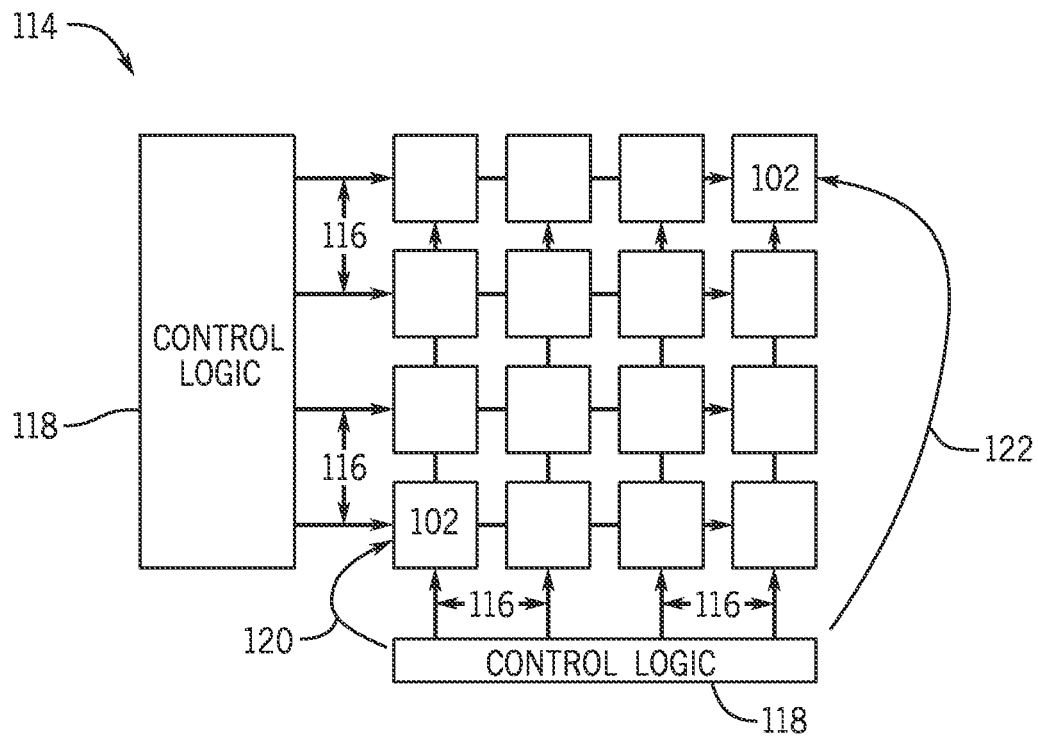
FIG. 8 is a schematic diagram of a column and line DAC, in accordance with an embodiment of the present disclosure.

In some embodiments, the DAC 40 or the DAC/modulator 44 may include a DAC other than the fractal DAC 100, such as a column and line DAC 114 shown in FIG. 8. In some scenarios, the column and line DAC 114 may include a multitude of control signals 116 from control logic 118 feeding an array of unit cells 102. For example, the control logic 118 of the column and line DAC 114 may incorporate binary to thermometric conversion and/or take into consideration the desired states of multiple individual unit cells 102 concurrently or simultaneously to determine control signals 116 necessary for operation.

The fractal DAC 100 may include data paths (physically and/or logically) to each unit cell 102 that are substantially of the same dimensions, components, and/or number of components, which may further increase linearity and/or synchronicity. For example, returning briefly to FIG. 6, starting from the incoming digital signal 56 and the first decision unit 106A, the data path to each unit cell 102 and the number of decision units 106 traversed along the data path is the same for each unit cell 102. In other words, a fractal DAC 100 may include data paths that are substantially the same, innately providing the decoded incoming signal 108 to each of the unit cells 102 concurrently or at substantially the same time. As should be appreciated, in some embodiments, some data paths of a fractal DAC 100 may differ due to manufacturing tolerances, physical layout constraints, data-line-to-data-line coupling, and/or additional implementation factors and interference. The substantially similar data paths of the fractal DAC 100 may reduce or eliminate a wait time associated with the difference between shorter and longer data paths (e.g., the difference between data path 120 and data path 122 in a column and line DAC 114), further increasing the operable speed of the fractal DAC 100. As discussed above, the decision units 106 may recursively split the digital signal 56, at each level of decision unit(s) 106, and output an MSb signal 110 and an LSb signal 112 to different branches of the fractal DAC 100. As used herein, the "level" of a decision unit 106 may refer to how many decision units 106 have been traversed by the digital signal 56. For example, referring back to FIG. 6, decision unit 106A may be considered to be at level one, decision unit 106B may be considered to be at level two, and so on.

Figure 9:
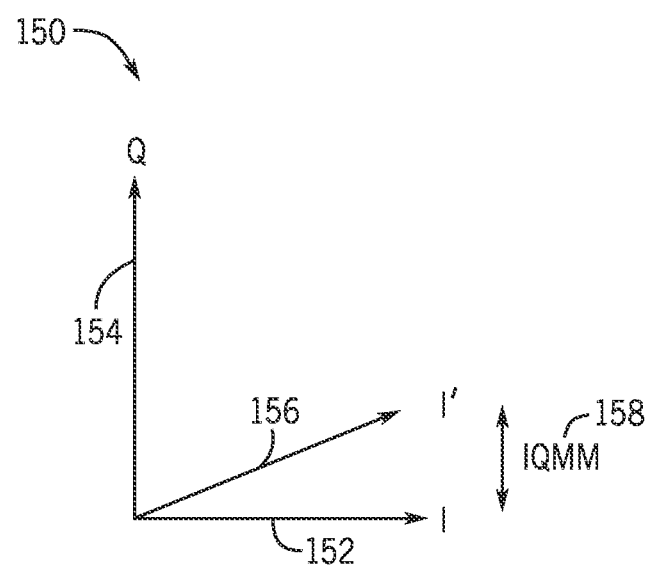
FIG. 9 is a graph illustrating IQ (e.g., quadrature signal) mismatch associated with the DAC of FIG. 4 and/or the fractal DAC of FIG. 6.

As discussed above, the techniques discussed herein may be applicable to a fractal DAC 100, a column and line DAC 114, or any suitable device that uses quadrature signals. Furthermore, as should be appreciated, while discussed herein as utilized with respect to quadrature signals (e.g., signals with 90-degree phase relationships), the present techniques may also be applicable to measure and/or compensate for phase mismatches in any suitable set of phasor-related signals having a set offset. With this in mind, FIG. 9 is a graph 150 illustrating IQ (e.g., quadrature signal) mismatch. IQ mismatch is a non-ideality that occurs whenever the I and Q vectors of the quadrature signals are not aligned to be offset 90 degrees from each other. An I signal 152 and a Q signal 154 have no mismatch when there is a 90-degree offset between the phase of the I signal 152 and the phase of the Q signal 154. However, if the phase of the I signal 152 or the Q signal 154 is such that the offset between the I signal 152 and the Q signal 154 is greater or less than 90 degrees, such as is shown by the I' signal 156, there exists an IQ mismatch 158.

The I signal 152 and the Q signal 154 may, in some cases, be measured via direct or indirect measurement during manufacturing (e.g., after fabrication). For example, an output signal of an RFDAC utilizing a quadrature signal as a local oscillator (LO) may be measured, and an IQ mismatch 158 derived therefrom. In some cases, IQ mismatch may be determined once during manufacturing by generating RF waves (e.g., a transmitted signal), measuring an error with respect to the transmitted signal, and setting/applying a pre-distortion (e.g., a digital pre-distortion) to the operating signals of the RFDAC. However, in some cases IQ mismatch may increase or change over time or during normal operation of an electronic device (e.g., due to various device non-idealities such as age and environment). Consequently, it may be beneficial to measure and correct for IQ mismatch 158 throughout the life of the electronic device 10 (e.g., periodically or continuously during operation of the electronic device 10). In doing so, IQ mismatch due to non-idealities (e.g., heat, age of the electronic device 10) may be mitigated or eliminated during normal use and operation of the electronic device 10.

As previously stated, at certain frequencies (e.g., RF rate frequencies), IQ mismatch 158 may affect the EVM performance of the RFDAC IQ architecture when transmitting a modulated signal. Indeed, IQ mismatch 158 may result in EVM degradation, which may impact the overall RFDAC performance. As such, in some embodiments, IQ compensation circuitry may be deployed in the RFDAC to measure and compensate for the IQ mismatch 158. The IQ compensation circuitry may enable digital integration (e.g., full-CMOS integration) of the measurement and/or compensation procedures. In some embodiments, the IQ compensation circuitry uses a flip-flop structure to exploit the fact that phase-vectors in CMOS logic include digital pulses, and, as such, the mismatch between I and Q pulses with may be measured as a skewed rise-to-rise and fall-to-fall delay (e.g., in picoseconds (ps)) between phases. While the signal mismatch measuring and compensation is discussed below with respect to quadrature signals (e.g., I signals 152 and Q signals 154), it should be noted that such measurement and compensation may apply to any signals with a desired phase relationship.

Figure 10:
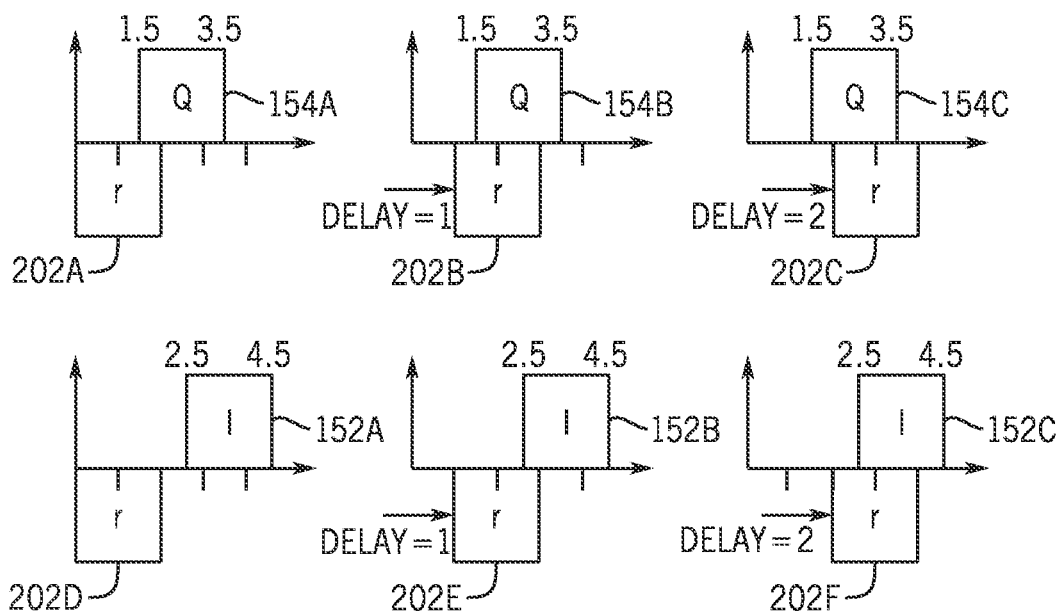
FIG. 10 is a diagram illustrating the measurement of the I signals and the Q signals with respect to a reference signal, in accordance with an embodiment of the present disclosure.

To perform accurate mitigation measures, accurate measurement of the rising and falling edges of the I signals 152 and Q signals 154 may be determined. FIG. 10 is a diagram illustrating the measurement of the I signals 152 and the Q signals 154 with respect to a reference signal, according to embodiments of the present disclosure. The Q signals 154A, 154B, and 154C (collectively, the Q signals 154) and the I signals 152A, 152B, and 152C (collectively, the I signals 152) may include digital pulses that may be measured (e.g., in the time domain) with respect to reference signals 202A, 202B, 202C, 202D, 202E, and 202F (collectively, the reference signal 202). The Q signals 154A, 154B, and 154C may include pulses of the Q signal 154 at various times and the I signals 152A, 152B, and 152C may include pulses of the I signal 152 at various times.

The reference signal 202 may be deployed with various delays to enable accurate measurement of the rising and falling edges of the Q signal 154 and the I signal 152. For example, the reference signals 202A and 202D may include a first delay (e.g., delay=0 ps), the reference signals 202B and 202E may include a second delay (e.g., delay=1 ps or more, 2 ps or more, 5 ps or more, 10 ps or more, and so on), and the reference signals 202C and 202F may include a third delay (e.g., a delay=2 ps or more, 4 ps or more, 10 ps or more, 20 ps or more, and so on). As should be appreciated, the delays discussed herein may be of any suitable granularity, and the time associated with such delays may be based on implementation (e.g., frequency).

The rising edge of the Q signal 154 and/or the I signal 152 may be measured based on the value of the delay applied to the reference signal 202, when the reference signal 202 overlaps with the rising edge of the Q signal 154 and/or I signal 152, which occurs at the point at which the pulse value of the Q signal 154 and/or the I signal 152 transitions from low to high. The position of the falling edge of the Q signal 154 and/or the I signal 152 may be measured based on the value of the delay applied to the reference signal 202 when the reference signal 202 overlaps with the falling edge of the Q signal 154 or I signal 152, which occurs at the point at which the pulse value of the Q signal 154 and/or I signal 152 transitions from high to low.

Figure 11:
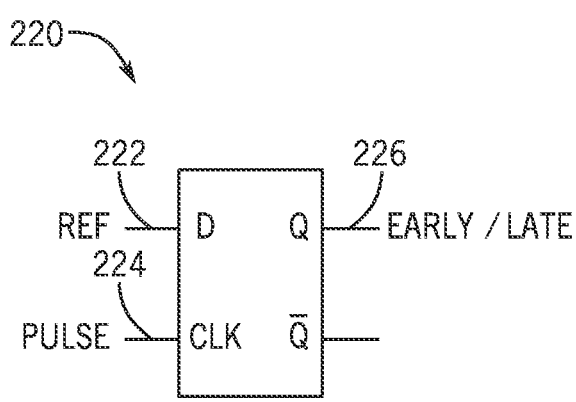
FIG. 11 is schematic diagram of a flip-flop sensor that may determine the overlap between the reference signal and I signal/Q signal to determine a change of state of the I signal and/or the Q signal.

FIG. 11 is a schematic diagram of a latch sensor (e.g., flip-flop sensor 220) that may be used to determine the overlap between the reference signal 202 and I signal 152/Q signal 154 and to determine when a change of state of the I signal 152 and/or the Q signal 154 occurs relative to the reference signal 202, according to embodiments of the present disclosure. When considering two pulses (e.g., pulses associated with reference signal 202 and the I signal 152 or the Q signal 154), it may be beneficial to determine when the edges of the two pulses are early or late with respect to one another to determine if the reference signal 202 is detecting a rising or falling edge of the quadrature signals. The flip-flop sensor 220 may sample the reference signal 202 at the D input 222 using the Q signal 154 or the I signal 152 as a clock signal on the clock input 224, which results in a high readback output (e.g., a binary 1) at the Q output 226 whenever the reference signal 202 is early with respect to the quadrature signal (e.g., indicating a rising edge of the quadrature signal) or results in a low readback output (e.g., a binary 0) at the Q output 226 whenever the reference signal 202 is late with respect to the quadrature signal (e.g., indicating a falling edge of the quadrature signal). It may be appreciated that the Q output 226 outputs a relative signal indicating the relationship between the reference signal 202 and a quadrature signal (e.g., the I signal 152 or the Q signal 154).

The compactness of the flip-flop sensor 220 allows for its placement at the core of the DAC 40. In some embodiments, the flip-flop sensor 220 may be placed at or near the position of a unit cell 102 of the fractal DAC 100, and may in some embodiments replace the unit cell 102, ensuring that the IQ mismatch measured is as seen at the last output stage corresponding to the output of the IQ mismatch. Multiple sensors may be deployed, which may facilitate accounting for mismatch over multiple paths. For example, different paths or branches of the fractal DAC 100 and/or column and line DAC 114 may have different fabrication asymmetries, and deploying multiple flip-flop sensors 220 may enable the DAC 40 to account for multiple or all of the various asymmetries (e.g., and thus the various IQ mismatches). Multiple flip-flop sensors 220 may also provide enhanced functionality, such as measuring positive and negative edge positions simultaneously.

It may be beneficial to deploy two flip-flop sensors 220, one to measure the rising edge transition and one to measure the falling edge transitions of the quadrature signals, each with reversed clock polarity, respectively. In some embodiments, one flip-flop sensor 220 may be used. Indeed, one sensor is capable of detecting both rising and falling transitions of a signal by looking at the transition of the output 226 from 0 to 1 (quadrature signal rising edge) or 1 to 0 (quadrature signal falling edge). However, in some cases it may be difficult to determine the relationship between rising and falling edge positions (e.g., duty cycle). In such a configuration, a typical CMOS sensor such as a flip-flop may not have identical delay time between rising and falling transitions of an input signal. Consequently, it may be advantageous to use multiple flip-flop sensors 220 to measure rising and falling signal edges.

Figure 12:
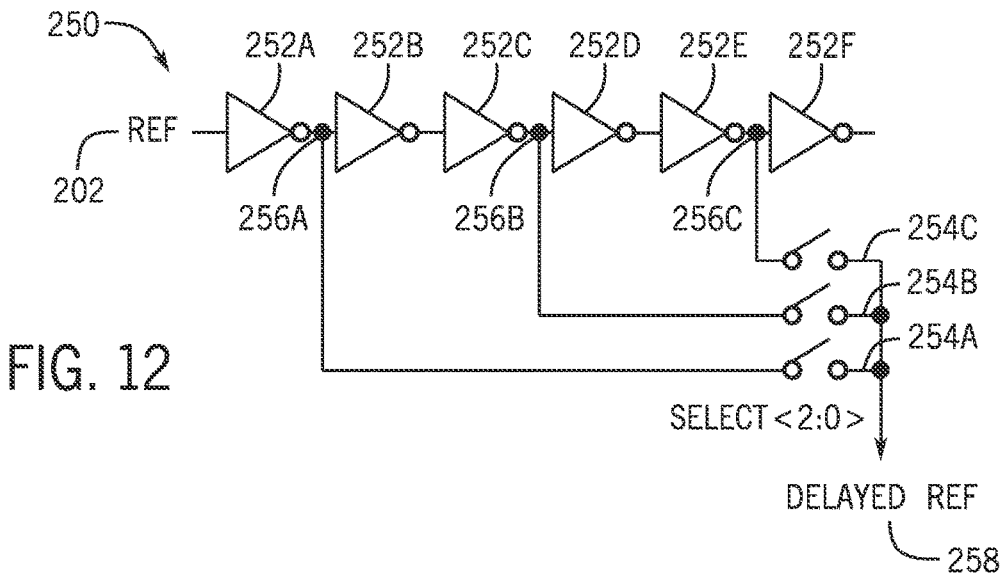
FIG. 12 is a schematic diagram of a tapped delay line that may provide delay to the reference signal to enable measurement of the I signal and the Q signal.

FIG. 12 is a schematic diagram of a tapped delay line 250 that may provide delay to the reference signal 202 to enable measurement of the I signal 152 and the Q signal 154. The tapped delay line 250 may include a set of cascaded inverters 252A, 252B, 252C, 252D, 252E, and 252F (collectively, the inverters 252). The tapped delay line 250 may include switches coupled to tap points between the inverters 252. For example, a switch 254A is coupled to a tap point 256A between the output of the inverter 252A and the input of the inverter 252B, a switch 254B is coupled to a tap point 256B between the output of the inverter 252C and the input of the inverter 252D, and a switches 254C is coupled to tap point 256C between the output of the inverter 252E and the input of the inverter 252F. The switches 254A, 254B, and 254C may collectively be referred to herein as the switches 254; and the tap points 256A, 256B, and 256C may collectively be referred to herein as the tap points 256. While the switches 254 are shown coupled to the tap points 256 between sets of two cascaded inverters 252, it should be noted that the switches 254 may be coupled between any number of cascaded inverters 252 (e.g., between each inverter, between sets of three inverters or more, between sets of 10 cascaded inverters or more, and so on).

The inverters 252 may each be associated with a unit of delay. For example, each inverter 252 may provide (e.g., in the analog domain) a delay of 1 picosecond (ps) or more, 5 ps or more, 20 ps or more, and so on to the reference signal 202. The amount of delay in the tapped delay line 250 may be adjusted by selecting various switches 254. For example, each inverter 252 may provide a 5 ps delay to the reference signal 202 in the tapped delay line 250 to generate delayed reference signal 258. By closing the switch 254A, a 5 ps delay may be provided to the reference signal 202 in the tapped delay line 250 to generate delayed reference signal 258; by closing the switch 254B, a 15 ps delay may be provided to the reference signal 202 in the tapped delay line 250 to generate delayed reference signal 258; and by closing the switch 254C, a 25 ps delay may be provided to the reference signal 202 in the tapped delay line 250 to generate/provide the delayed reference signal 258.

By closing one of the switches 254 and adjusting the delay of the tapped delay line 250, different delays associated with the reference signal 202 may be probed until a transition region (e.g., indicating a transition from high-to-low or low-to-high) associated with the I signal 152 and/or the Q signal 154 may be identified. To detect the change of state indicating a transition region, a sensor (e.g., the flip-flop sensor 220) may be used as described with respect to FIG. 11. Accordingly, the tapped delay line 250 may enable an amount of delay applied to the reference signal 202 in an accurately controlled manner to determine the position of the reference signal 202 with respect to the I signal 152 and the Q signal 154.

By determining a delay step of the tapped delay line 250 (e.g., if the delay step includes a 10 ps delay step) and determining an overlap between the reference signal 202 and the quadrature signals (e.g., the I signal 152 and/or the Q signal 154), as discussed with respect to FIG. 10, the distance between the I signal 152 and the Q signal 154 (e.g., the IQ mismatch) may be determined. For example, briefly returning to FIG. 10, by determining that the delay step is 10 ps it may be estimated that the I signal 152 and the Q signal 154 are at a distance of 1 code (e.g., 10 ps), and that the pulse width of the I signal 152 and the Q signal 154 is 20 ps. If it is determined that the frequency of operation includes a 40 ps period, the I signal 152 and the Q signal 154 may be determined to be in the desired quadrature relationship (e.g., offset from each other by 90-degrees).

It should be noted that since relative distances are used to determine the phase relationship between the pulses, the absolute value of the measurement itself may not be considered. If, for example, the absolute position of the edge of the I signal 152 would measure to be 2.6 code instead of 2.5 code, it may be determined that the IQ mismatch includes a misalignment of 0.1 code (e.g., 1 ps). Therefore, correct estimate of the IQ mismatch may be provided by direct pulse edge position measurement.

It may be appreciated that, in some cases, accuracy is given by the delay step fineness (e.g., 10 ps) in the measurement. However, depending on implementation (e.g., frequency) the tapped delay line 250 may be relatively coarse in relation to the IQ mismatch 158. Indeed, in some scenarios <1-degree error may correspond to sub-picosecond accuracy (e.g., at certain (higher) frequencies). Accuracy of the measurement may be augmented by means of averaging in the presence of randomness. Indeed, by performing multiple measurements with a degree of random error, the systematic measurement of the IQ mismatch 158 may be averaged for increased accuracy. Adopting, for example, a 10 ps step size for the tapped delay line 250 (with no or negligible non-linearity error) and targeting an error of 0.5 ps (e.g., 0.9-degree error at 5 gigahertz (GHz)), such accuracy may be achieved with roughly 500 randomized measurement points. In some embodiments, a counter may be used to keep track of the number of randomized measurement points to ensure desired accuracy.

When having a differential non-linearity (DNL) superposed to the 10 ps step size such as that the delay line steps are irregularly spaced (e.g., such as a sequence of steps including 9 ps, 11 ps, 10 ps), the measurement procedure may not be limited by DNL performance as long as averaging occurs over multiple delay elements of the tapped delay line 250. This may be achieved by means of applying a randomization method which is strong enough in its impact to have an edge position occur over multiple codes of the tapped delay line 250 when measuring (e.g., a randomization greater than the time step of the tapped delay line 250), which may average the residual DNL.

Figure 13:
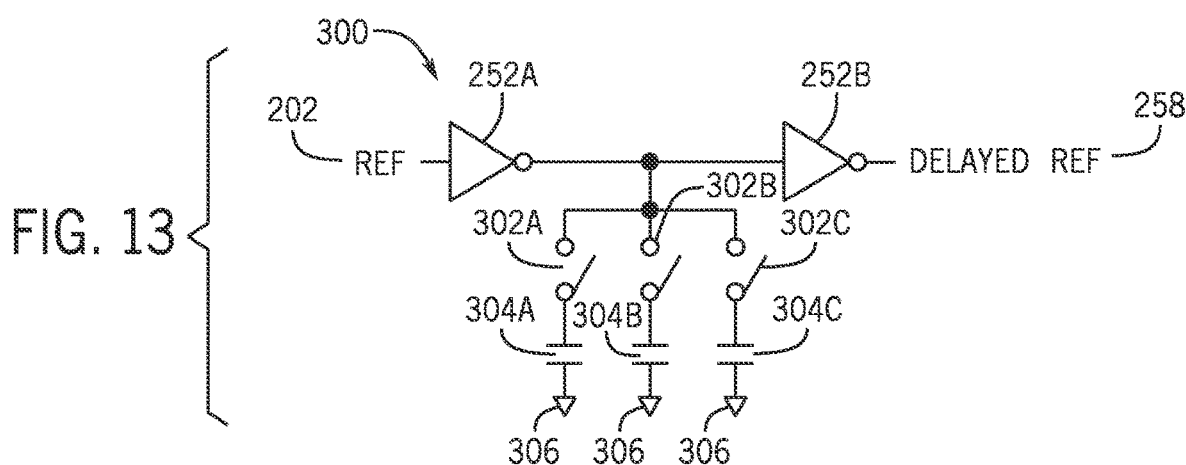
FIG. 13 is a schematic diagram of an additive delay circuit that may provide an additional or additive delay to the reference signal delay provided by the tapped delay line, according to embodiments of the present disclosure.

In some instances, it may be beneficial to adjust the delay of the reference signal 202 in intervals that are greater than (e.g., more coarse-grain) or smaller than (e.g., more fine-grain) than the delay provided by the tapped delay line 250. FIG. 13 is a schematic diagram of an additive delay circuit 300 that may provide an additional or additive delay to the reference signal delay provided by the tapped delay line 250, according to embodiments of the present disclosure. The additive delay circuit 300 may include a switch 302A, a switch 302B, and a switch 302C (referred to herein as the switches 302) coupled between the inverters 252A and 252B (e.g., of the tapped delay line 250).

Each of the switches 302 may be coupled to a capacitive element, such as a capacitor, such that a capacitor 304A is coupled between the switch 302A and a ground 306, a capacitor 304B is coupled between the switch 302B and the ground 306, and a capacitor 304C is coupled between the switch 302C and the ground 306. By closing one or more of the switches 302, various delays may be applied to the reference signal 202. For example, by closing the switch 302A, a delay of 1 ps may be applied to the reference signal 202, by closing the switch 302B, a delay of 2 ps may be applied to the reference signal 202, and by closing the switch 302C, a delay of 4 ps may be applied to the reference signal 202C. As should be appreciated, the additive delay circuit 300 may be implemented before, after, or between inverters of the tapped delay line 250.

Figure 14:
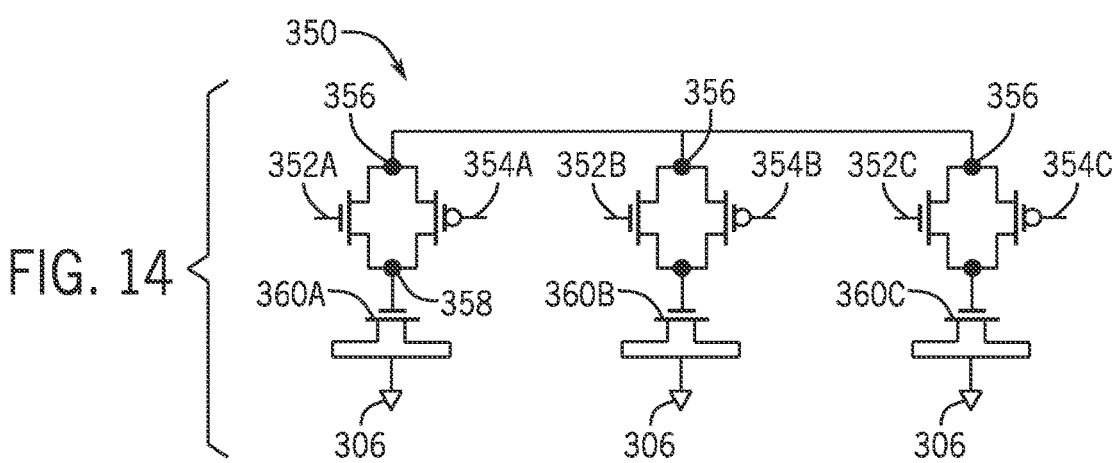
FIG. 14 is a schematic diagram of an additive delay metal-oxide semiconductor (MOS) circuit that may serve as an alternative implementation of the additive delay circuit of FIG. 13, according to embodiments of the present disclosure.

FIG. 14 is a schematic diagram of an additive delay metal-oxide semiconductor (MOS) circuit 350 that may serve as an alternative implementation of the additive delay circuit 300 discussed with respect to FIG. 13, according to embodiments of the present disclosure. The switches 302 of the additive delay circuit 300 may include two drain-source coupled transistors 352A and 354A. For example, the transistor 352A may include an n-channel metal oxide semiconductor field-effect transistor (nMOS) and the transistor 354A may include a p-channel metal oxide semiconductor field-effect transistor (pMOS). The drain of the transistor 352A and the source of the transistor 354A are coupled together at the terminal 356. The source of the transistor 352A and the drain of the transistor 354A are coupled together at the terminal 358. The capacitors 304 of the additive delay circuit 300 may also be replaced by nMOS transistors. For instance, the source of the transistor 352A and the drain of the transistor 354A are coupled to a gate terminal of a transistor 360A at the terminal 358, and the drain and source terminals of the transistor 360A are coupled together (e.g., shorted) to the ground 306. The transistors 352B, 354B, and 360B and 352C, 354C, and 360C are also disposed in a similar arrangement to the transistors 352A, 354A, and 360A.

Furthermore, in some embodiments, additional or alternative methods to generate an delays may be implemented. For example, a perturbation may be added to a VDD power of the tapped delay line 250 or the additive delay circuit 300/additive delay MOS circuit 350. A varied VDD may result in a different $V_{TH}$ applied to the delay line gates and as such a different delay of the unit elements (e.g., different speed), where the higher the VDD the faster the delay line and the smaller the unit delay. When measuring rising and falling edges together, one error which may not be recoverable through averaging is the asymmetric behavior of the flip-flop sensor 220 and the tapped delay line 250 or the additive delay circuit 300/additive delay MOS circuit 350 with respect to rising and falling edges of the Q signal 154 and/or I signal 152. A double measurement circuit capable of detecting rising and falling edges simultaneously may be implemented in situations where no intrinsic offset occurs between the rising and falling edges measurement. Such a double measurement circuit may be identical to the measurement circuits described above with respect to FIGS. 10-14, with the polarity of the clock input 224 swapped such that the clock input 224 triggers in the opposite direction of the single measurement circuit described above. An accurate measurement of rising and falling edges relative positions enables the measurement circuits to calibrate IQ mismatch between phases of the Q signal 154 and the I signal 142, but also duty cycle errors within a single phase and between multiple phases.

Figure 15:
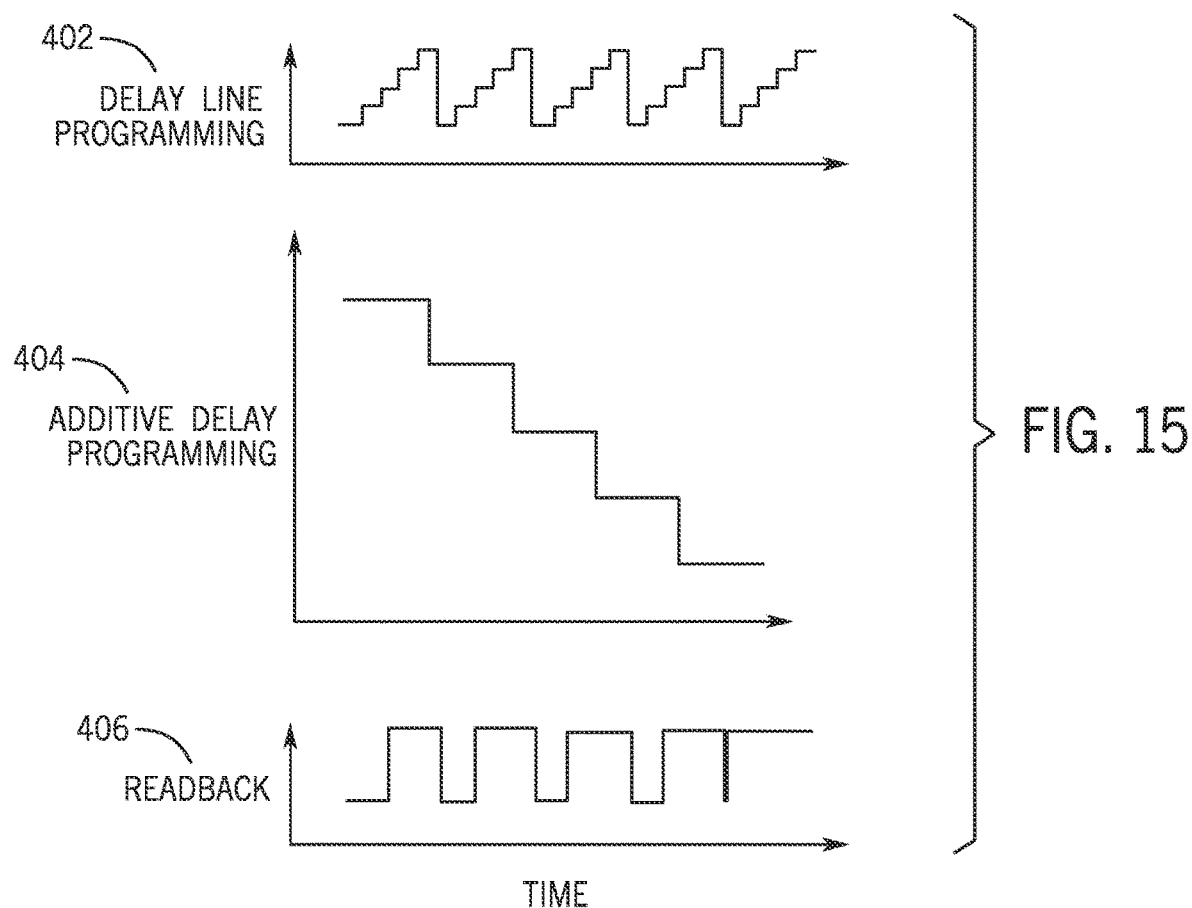
FIG. 15 is an illustration of various signal sequences used to measure the rising and falling edges of the I signal and the Q signal, according to embodiments of the present disclosure.

FIG. 15 is an illustration of various sequences of delays added to the reference signal 202 used to measure the rising and falling edges of the I signal 152 and the Q signal 154, according to embodiments of the present disclosure. To measure the position of the rising edges and the falling edges of the I signal 152 or the Q signal 154, a ramp on the tapped delay line programming may be provided to the reference signal 202, and the positions upon which changes to a readback signal (e.g., an output signal of the flip-flop sensor 220) may be stored as either rising or falling transition positions of the I signal 152 and/or the Q signal 154, depending on the direction of the transition itself. The tapped delay line programming ramp 402 illustrates delay line programming with respect to the reference signal 202, such as the delay provided by the tapped delay line 250 of FIG. 12. The additive delay programming ramp 404 illustrates additive delay, such as the additive delay provided by the additive delay circuit 300 or the additive delay MOS circuit 350. The readback ramp 406 illustrates readback, which includes a signal that is output from the flip-flop sensor 220. When delay line delay is increased, at a certain point the reference signal 202 crosses over (e.g., the reference signal 202E crosses over the I signal 152B, as illustrated in FIG. 10) and the readback becomes a logical high. The observed readback signal may include a series of logical highs (e.g., 1s) and logical lows (e.g., 0s). For example, if a signal has a period of 100 ps, and the tapped delay line 250 has a step of 10 ps, the signal may include a series of five 1s and five 0s, such that the signal may be represented as 1111100000.

The pulses represented by the tapped delay line programming ramp 402, the additive delay programming ramp 404, and the readback ramp 406 may be averaged out to provide an accurate estimation of the rising and falling positions of the reference signal 202. To provide averaging functionality, the tapped delay line programming ramps 402 may be repeated per each one of the additive delay programming codes (e.g., a code including a 10 ps step size) on a synchronized ramp that may update once per delay line programming cycle. The first position of the edge's readback position are accumulated at every delay line programming cycle. At a certain time, an average edge position may be determined after full sequencing is completed. The average edge position may be measured by an accumulator, which may accumulate all or a portion of all observed edge positions of the quadrature signal. The value determined by the accumulator may then be divided by the number of additive delay programming cycles.

It may be observed from FIG. 15 that the tapped delay line programming ramp 402 includes several ascending ramps illustrating multiple delay line programming cycles, while the additive delay programming ramp 404 includes a descending ramp. Inverting the additive delay programming ramp 404 with respect to the tapped delay line programming ramp 402 may, together with deployment of anti-wraparound logic, prevent the wrapping-around of signal edge position between subsequent delay line programming cycles. As discussed previously, the readback signals of the readback ramp 406 may include sequences of 1s and 0s. Consequently, it may become difficult to differentiate the end of a first signal and the beginning of a second signal at the next delay stage. For example, if a first signal pulse of a first delay line programming cycle ends in a series of 0s and a second (e.g., consecutive) signal pulse of a second delay line programming cycle begins in a series of 0s, it may be difficult to differentiate the delineation between the first and the second signal.

When applying delay, due to the periodic nature of the observed pulses of the ramps, a delayed version of a reference pulse of the reference signal 202 may wrap around. That is, the first edge determined is not a delayed version of a first reference pulse of the reference signal 202, it may be an edge of a different pulse of the reference signal 202 entirely (e.g., a pulse corresponding to a subsequent delay line programming cycle).

Inverting the additive delay programming ramp 404 with respect to the tapped delay line programming ramp 402 may substantially alter the step size between a last pulse of a first delay line programming cycle of the tapped delay line programming ramp 402 and a first pulse of a second delay line programming cycle of the tapped delay line programming ramp 402. Moreover, anti-wraparound logic may be implemented, which considers as first edges only those edges which are in proximity of a previously measured edge position. This may be implemented via a disabling pulse which masks readings which are too low (e.g., below a threshold) compared to the previously measured edge position (e.g., below a previous position diminished by a certain margin). Additionally, the inverse nature of the additive delay programming ramp 404 facilitates wraparound prevention by ensuring that the beginning of a subsequent pulse of the reference signal 202 is below the threshold.

Figure 16:
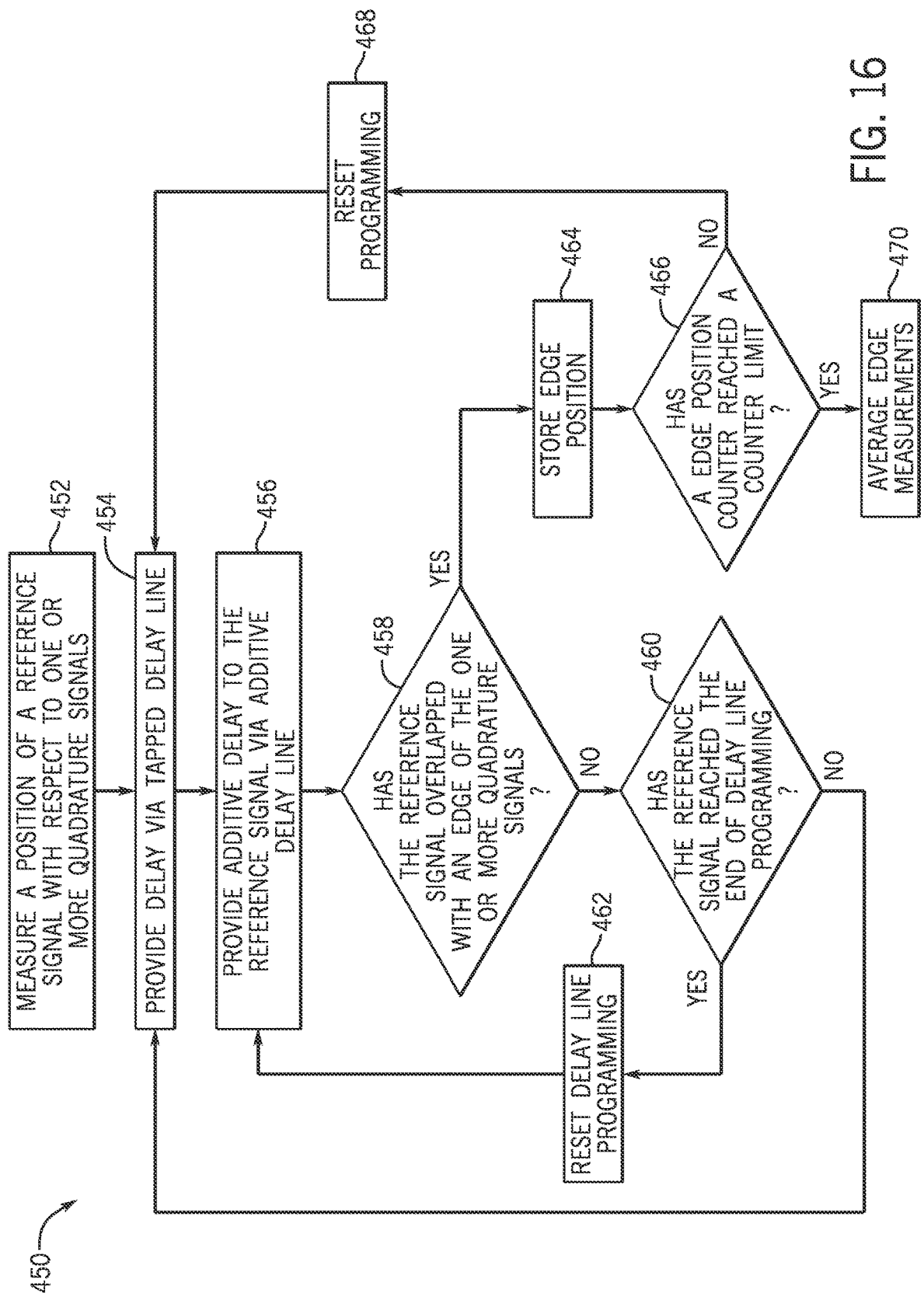
FIG. 16 is a flowchart of a method for measuring the edge positions of the I signal and Q signal via the reference signal and the measurement circuitry, according to embodiments of the present disclosure.

FIG. 16 is a flowchart of a method 450 for measuring the edge positions of the I signal 152 and Q signal 154 via the reference signal 202 and the measurement circuitry discussed above, according to embodiments of the present disclosure. Any suitable device (e.g., a controller) that may control components of the electronic device 10, may perform the method 450. In some embodiments, the method 450 may be implemented by executing instructions stored in a tangible, non-transitory, computer-readable medium, such as the memory 14 and/or storage 16, using the processor 12. For example, the method 450 may be performed at least in part by one or more software components, such as an operating system of the electronic device 10, one or more software applications of the electronic device 10, and the like. While the method 450 is described using steps in a specific sequence, it should be understood that the present disclosure contemplates that the described steps may be performed in different sequences than the sequence illustrated, and certain described steps may be skipped or not performed altogether.

In process block 452, the processor 12 may measure a position of the reference signal 202 with respect to one or more quadrature signals (e.g., the I signal 152 and the Q signal 154). The processor 12 may perform the measurements using the processes and systems described above with respect to FIGS. 10-15. In process block 454, the processor 12 may provide delay via the tapped delay line 250, as discussed with respect to FIGS. 12-15. In process block 456, the processor may provide additive delay to the reference signal 202 via the additive delay circuit 300 (or the additive delay MOS circuit 350), as discussed with respect to FIGS. 13-15.

In query block 458, the processor determines whether the reference signal 202 has overlapped with an edge of one or more quadrature signals (e.g., has not overlapped the edge of the I signal 152 and/or the Q signal 154). In other words, it may be determined whether a transition has occurred to indicate a rising or falling edge of the I signal 152 and/or the Q signal 154. If the processor 12 determines that the reference signal has not overlapped an edge of the one or more quadrature signals (e.g., as shown by the reference signal 202D in FIG. 10), in query block 460, the processor 12 determines whether the reference signal 202 has reached the end of a delay line programming cycle. If the processor 12 determines in the query block 460 that the reference signal 202 has not reached the end of the delay line programming cycle, the processor may increment the delay provided to the reference signal via the tapped delay line 250.

However, if the processor 12 determines, in the query block 460, that the reference signal 202 has reached the end of the delay line programming cycle, the processor may, in process block 462, reset the delay line programming cycle (e.g., to begin a new delay line programming cycle), and return to the process block 456 to increment the additive delay provided to the reference signal 202 via the additive delay circuit 300 (or the additive delay MOS circuit 350).

Returning to the query block 458, if the processor determines that the reference signal 202 does overlap with an edge of the one or more quadrature signals (e.g., as illustrated by reference signals 202A, 202B, 202C, 202E, and 202F in FIG. 10), the processor may, in process block 464, store the edge position in the memory 14 or the storage 16.

In query block 466, the processor determines whether an edge position counter has reached a measurement point counter limit. If the processor determines that the edge position counter has not reached a limit of the randomized measurement points, in process block 468 the processor may reset the programming of the delay lines and apply a delay via the tapped delay line 250 or the additive delay circuit 300/additive delay MOS circuit 350.

However, if the processor determines that the edge position counter has reached the limit, in process block 470 the processor 12 averages the edge measurements to determine the relative positions of the I signal 152 and the Q signal 154. Based on the determination of the positions of the I signal 152 and Q signal 154, the processor may determine the IQ mismatch 158. In this manner, the method 450 may enable measurement of the edge positions of the I signal 152 and Q signal 154 via the reference signal 202 and the various delay and measurement circuitries previously described.

Figure 17:
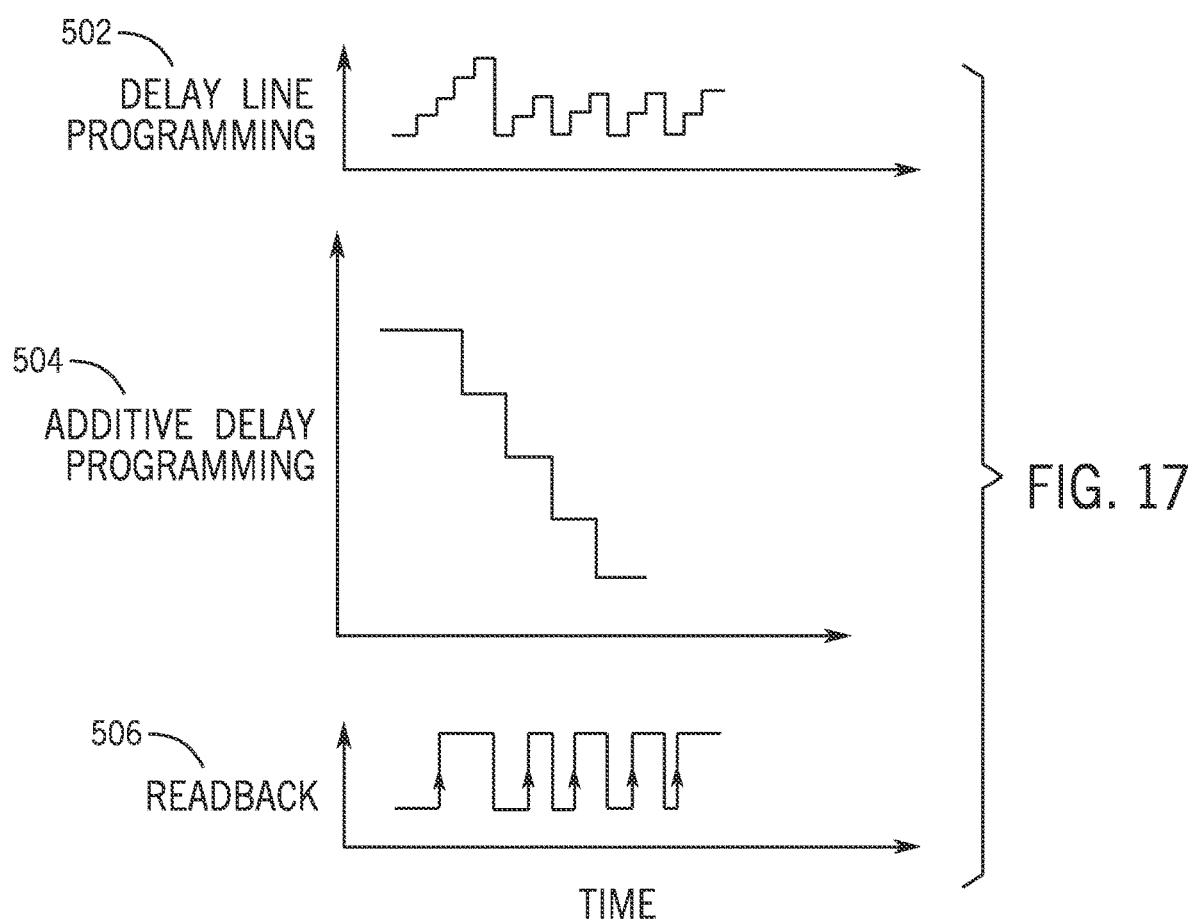
FIG. 17 is an illustration of fast logic signal sequences that may serve as an alternative to the various signal sequences of FIG. 15, according to embodiments of the present disclosure.

FIG. 17 is an illustration of logic signal sequences that may serve as an alternative to the various signal sequences discussed with respect to FIG. 15, according to embodiments of the present disclosure. The logic sequences may be implemented to provide anti-wraparound functionality with added speed benefits. For example, if an edge position of the one or more quadrature signals is found during a first delay line programming cycle, the additive delay programming may apply a smaller change to narrow the search range of positions sampled in subsequent programming cycles.

The search range of the delay line programming cycle may be restricted after the first cycle completes, an initial position of the edge of a quadrature signal is known, to an interval around the initially discovered edge position. The interval may be defined to have at its lowest the first discovered position diminished by a margin M and at its highest the discovered position augmented by a margin Mu for a total length of L. The range might be dynamically updated after every cycle upon a newly found edge position, or assumed to be valid throughout the sequence. As may be appreciated from fast logic delay line programming 502, fast logic additive delay programming 504, and fast logic readback, by restricting the range of cycles subsequent to the first cycle in which a quadrature signal edge is found, the sequence may execute faster than without the use of the fast logic.

Figure 18:
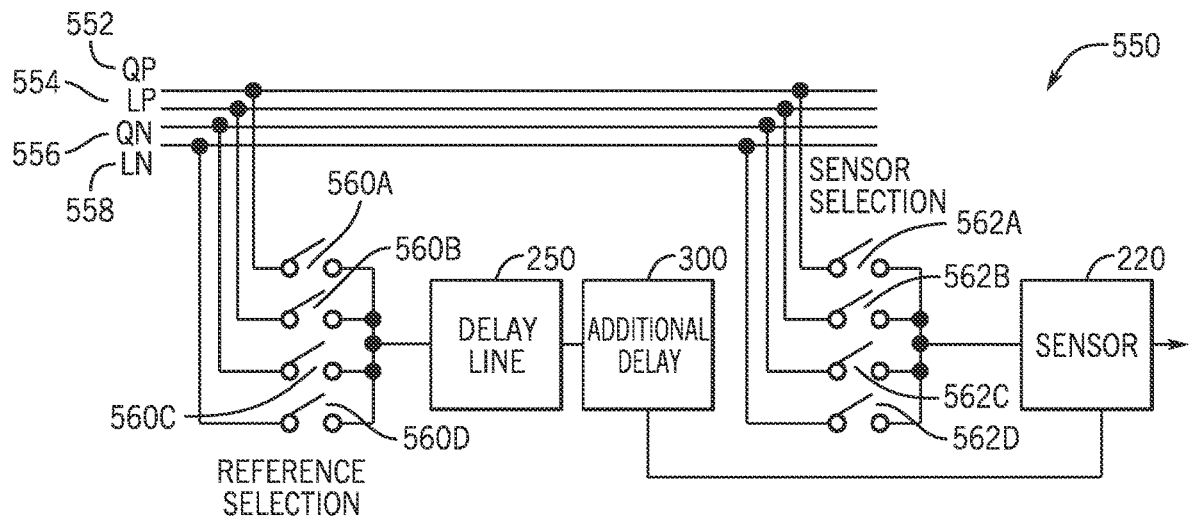
FIG. 18 is a diagram of a selection circuit that enables selection of phases of the reference signal and flip-flop sensor signals (e.g., readback signals), according to embodiments of the present disclosure.

FIG. 18 is a diagram of a selection circuit 550 that enables selection of phases of the reference signal 202 and flip-flop sensor 220 signals (e.g., readback signals), according to embodiments of the present disclosure. The selection circuit may enable comparison of four phases: Q phase ($Q_p$) 552, I phase ($I_p$) 554, Q-not ($Q_n$) 556, and I-not ($I_n$) 558. Q-not 556 is the inverse of the Q phase 552 and I-not 558 is the inverse of the I phase 554.

To compare the IQ mismatch between the four phases shown, the selection circuit 550 may be utilized, enabling switching of any selected phase to the same sensor (e.g., the flip-flop sensor 220). Using one sensor may enable comparison of the phase alignments without introducing sensor-to-sensor mismatches, as opposed to if multiple sensors were deployed for each phase. Additionally, to improve the averaging capabilities, the selection circuit 550 may be instantiated both at the source-side of the reference signal 202 (e.g., before the tapped delay line 250 and the additional delay circuit 300/additional delay MOS circuit 350), and also before the flip-flop sensor 220 measurement terminal. This placement may enable construction of an IQ mismatch matrix, which may improve accuracy of the measurement results.

Recalling that the flip-flop sensor 220 is a two-input device with a D input 222 and a clock input 224 (e.g., as discussed with respect to FIG. 11), the reference selection switches 560A, 560B, 560C, and 560D (collectively, the reference selection switches 560) may select any of the phases as an input signal to the D input 222. The sensor selection switches 562A, 562B, 562C, and 562D may select any of the phases to serve as the clock at the clock input 224. Accordingly, as there are four phases Q phase 552, I phase 554, Q-not 556 and I-not 558, there may be generated a 16-entry phase comparison matrix to compare the phase alignments between any two of the phases. Such a matrix may enable fast and accurate phase calculation to determine IQ mismatch.

It should be noted that the four phases illustrated in the selection circuit 550 are fully available to the consumer of the phases regardless of if a calibration sequence is running or not. Consequently, background calibration of the phases is enabled by the selection circuit 550.

Figure 19:
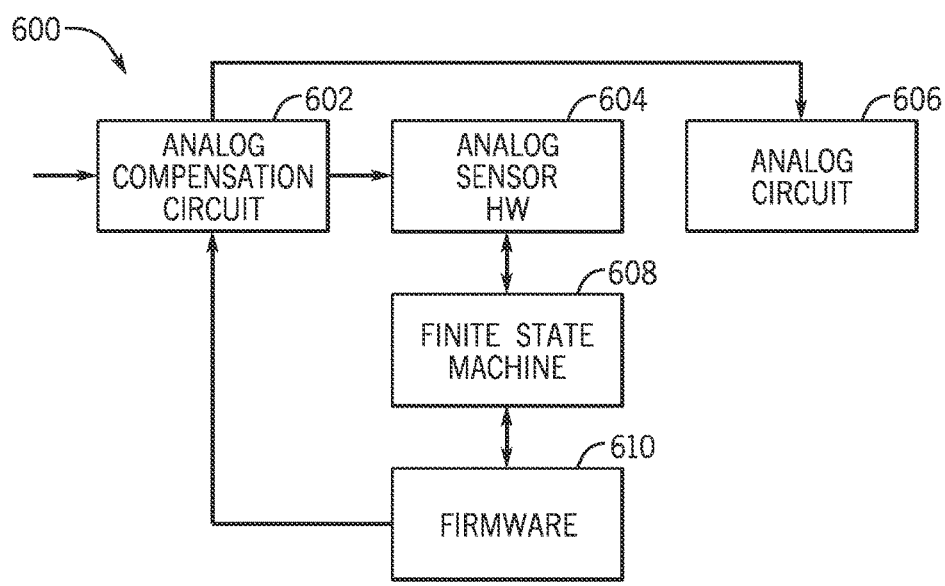
FIG. 19 is a block diagram of a self-calibration loop for compensating IQ mismatch, according to embodiments of the present disclosure.

FIG. 19 is a block diagram of a self-calibration loop 600 for compensating IQ mismatch, according to embodiments of the present disclosure. The self-calibration loop includes an analog compensation circuit 602, sensor hardware 604 (e.g., the flip-flop sensor 220, the delay circuitry, and so on), and an analog circuit 606 (e.g., a circuit that may receive the quadrature signals via the DAC 40 or the fractal DAC 100). Due to the large number of calculations that may be performed in identifying the edge positions of the I signal 152, the Q signal 154 and the overall IQ mismatch, a finite state machine 608 may be implemented to increase the speed of the edge detection sequencing. As the calculations and matrix manipulation described above may consume substantial memory, firmware 610 may be used for performing calculation (e.g., using a microprocessor, a controller, and so on).

Figure 20:
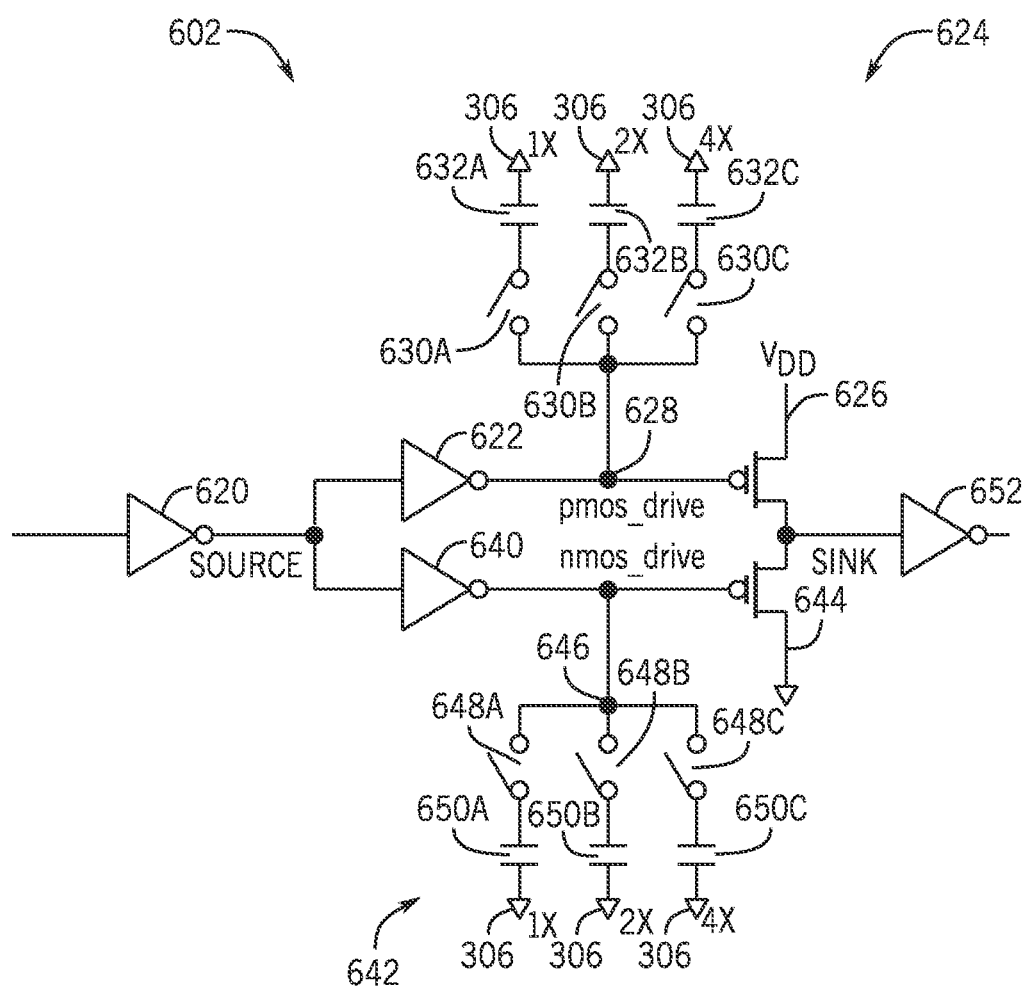
FIG. 20 is a schematic diagram of the analog compensation circuit, according to embodiments of the present disclosure.

FIG. 20 is a schematic diagram of the analog compensation circuit 602, according to embodiments of the present disclosure. The analog compensation circuit 602 may enable compensation of IQ mismatch with independent rise and fall transition control. The I signal 152 and/or the Q signal 154 may enter the analog compensation circuit 602 via a source inverter 620. The analog compensation circuit 602 includes a falling edge control component including an inverter 622, falling edge delay circuitry 624, and a pMOS 626. The inverter 620, the falling edge delay circuitry 624, and a gate terminal of the pMOS 626 may be coupled together at a node 628.

The falling edge delay circuitry 624 includes switches 630A, 630B, and 630C (collectively, the switches 630)

coupled to the node 628. The falling edge delay circuitry 624 includes capacitive elements (e.g., capacitors, transistors, and so on) coupled to the switches 630 that enable various delays to be provided when coupled to the pMOS 626 via the switches 630. The falling edge delay circuitry 624 includes a capacitor 632A coupled between the switch 630A and the ground 306; a capacitor 632B coupled between the switch 630B and the ground 306; and a capacitor 632C coupled between the switch 630C and the ground 306. By closing one or more of the switches 630, various delays may be applied to the falling edges of the I signal 152 and/or the Q signal 154. For example, closing the switch 630A may apply a delay of 1 ps to the falling edge of the I signal 152 and/or the Q signal 154, closing the switch 630B may apply a delay of 2 ps to the falling edge of the I signal 152 and/or the Q signal 154, and closing the switch 630C may apply a delay of 4 ps to the falling edge of the I signal 152 and/or the Q signal 154.

The analog compensation circuit 602 includes a rising edge control component including an inverter 640, rising edge delay circuitry 642, and an nMOS 644. The inverter 640, the rising edge delay circuitry 642, and a gate terminal of the nMOS 644 are coupled to a node 646. The rising edge delay circuitry 642 includes switches 648A, 648B, and 648C (collectively, the switches 648). The rising edge delay circuitry 642 includes capacitive elements (e.g., capacitors, transistors, and so on) coupled to the switches 648 that enable various delays to be provided when coupled to the nMOS 644 via the switches 648. The falling edge delay circuitry 642 includes a capacitor 650A coupled between the switch 648A and the ground 306; a capacitor 650B coupled between the switch 648B and the ground 306; and a capacitor 650C coupled between the switch 648C and the ground 306. By closing one or more of the switches 648, various delays may be applied to the rising edges of the I signal 152 and/or the Q signal 154. For example, closing the switch 648A may apply a delay of 1 ps to the rising edge of the I signal 152 and/or the Q signal 154, closing the switch 648B may apply a delay of 2 ps to the rising edge of the I signal 152 and/or the Q signal 154, and closing the switch 648C may apply a delay of 4 ps to the rising edge of the I signal 152 and/or the Q signal 154. The rising and/or falling edge adjustments supplied to the pMOS 626 and/or the nMOS 644 may be output to inverter 652.

In this manner, it should be appreciated that closing the switches 630, the analog compensation circuit 602 may adjust the falling edges of the I signal 152 or the Q signal 154; and by closing the switches 648, the analog compensation circuit 602 may adjust the rising edges of the I signal 152 or the Q signal 154 to mitigate or eliminate IQ mismatch. It should be noted that, the switches 630 and 648 may be implemented as transistors (e.g., similar to the structure discussed with respect to the additive delay MOS circuit 350). Further, while the capacitive elements are discussed as the capacitors 632 and 650, the capacitive elements may include transistors as well (e.g., similar to the structure discussed with respect to the additive delay MOS circuit 350). It should be noted that, while the analog compensation circuit 602 is discussed as including a rising edge control component and a falling edge control component separately, the analog compensation circuit 602 may be implemented with a single component (e.g., an inverter, delay circuitry, and MOS) that adjusts both the rising and falling edges of the I signal 152 and/or the Q signal 154.

In some cases, the IQ mismatch compensation provided by the analog compensation circuit 602 may include some compensation error, such that the IQ mismatch compensation does not compensate the IQ mismatch as desired. In such cases, it may be beneficial to evaluate and correct the IQ mismatch compensation provided by the analog compensation circuit 602.

Figure 21:
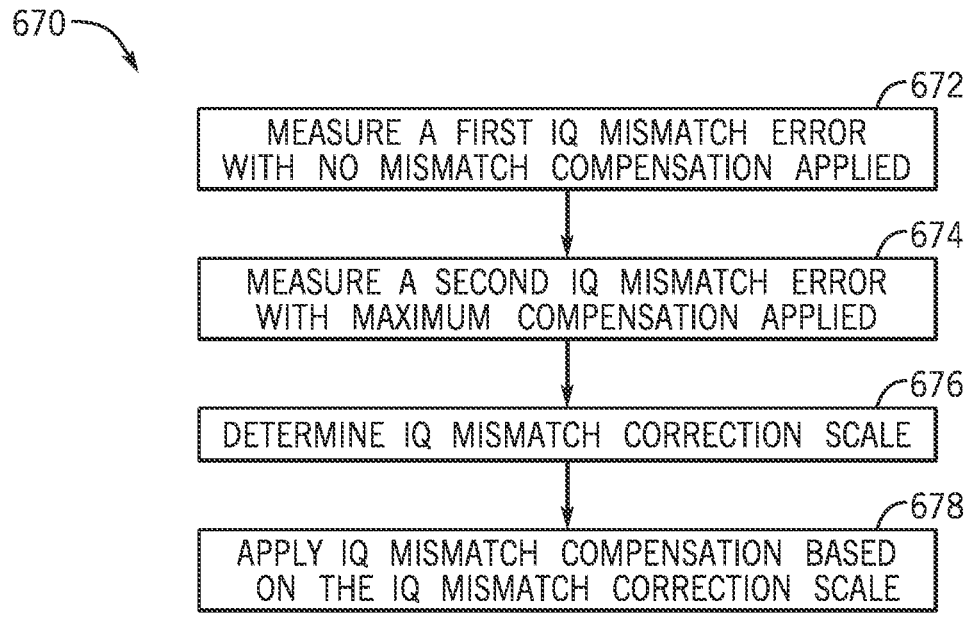
FIG. 21 is a flowchart of a method for applying analog compensation correction to mitigate or eliminate IQ mismatch compensation error, according to embodiments of the present disclosure.

FIG. 21 is a flowchart of a method 670 for applying analog compensation correction to mitigate or eliminate IQ mismatch compensation error, according to embodiments of the present disclosure. Any suitable device (e.g., a controller, the processor 12, IQ mismatch compensation circuitry, and so on) that may control components of the electronic device 10, may perform the method 670. In some embodiments, the method 670 may be implemented by executing instructions stored in a tangible, non-transitory, computer-readable medium, such as the memory 14 and/or storage 16, using the processor 12. For example, the method 670 may be performed at least in part by one or more software components, such as an operating system of the electronic device 10, one or more software applications of the electronic device 10, and the like. While the method 670 is described using steps in a specific sequence, it should be understood that the present disclosure contemplates that the described steps may be performed in different sequences than the sequence illustrated, and certain described steps may be skipped or not performed altogether.

In process block 672, the processor 12 may measure a first IQ mismatch error when no mismatch compensation is applied via the analog compensation circuit 602. In process block 674, the processor 12 may measure a second IQ mismatch error when a maximum mismatch compensation is applied via the analog compensation circuit 602. In process block 676, an IQ mismatch correction scale is applied. The IQ mismatch correction scale may be determined by measuring IQ mismatch as described with respect to the process block 672, when no compensation is applied, and measuring IQ mismatch as described with respect to the process block 674, when a maximum compensation is applied to determine an IQ mismatch delta. In process block 678, the processor 12 may apply an updated IQ mismatch compensation based on the determined IQ mismatch correction scale. In this manner, the method 670 determines an analog IQ mismatch compensation error and applies analog compensation correction to mitigate or eliminate the IQ mismatch compensation error.

Figure 22:
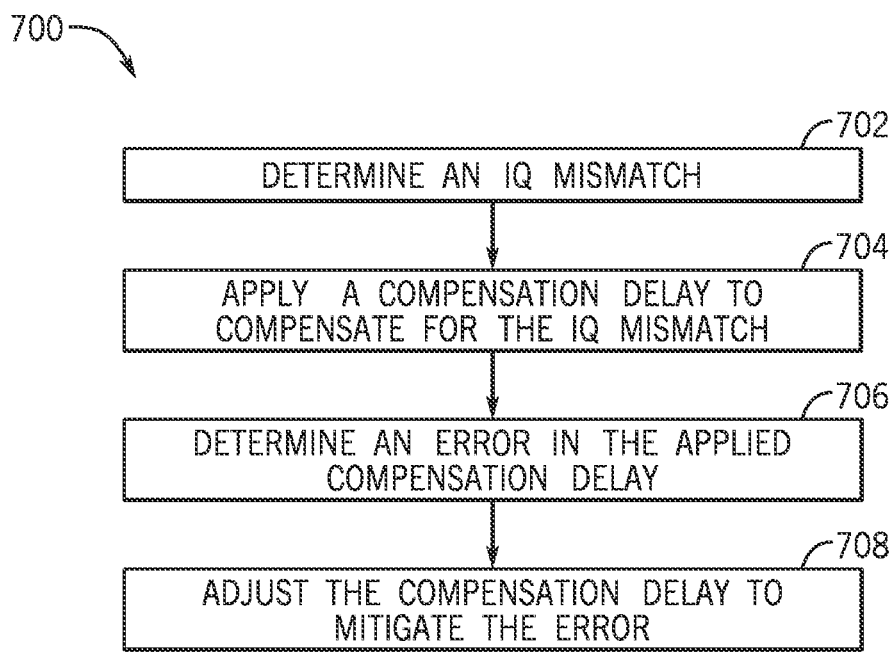
FIG. 22 is a flowchart of a method for determining an IQ mismatch and compensating for the IQ mismatch, according to embodiments of the present disclosure.

FIG. 22 is a flowchart of a method 700 for determining an IQ mismatch and compensating for the IQ mismatch, according to embodiments of the present disclosure. Any suitable device (e.g., a controller, the processor 12, the measurement and compensation circuitries discussed above, and so on) that may control components of the electronic device 10, may perform the method 700. In some embodiments, the method 700 may be implemented by executing instructions stored in a tangible, non-transitory, computer-readable medium, such as the memory 14 and/or storage 16, using the processor 12. For example, the method 700 may be performed at least in part by one or more software components, such as an operating system of the electronic device 10, one or more software applications of the electronic device 10, and the like. While the method 700 is described using steps in a specific sequence, it should be understood that the present disclosure contemplates that the described steps may be performed in different sequences than the sequence illustrated, and certain described steps may be skipped or not performed altogether.

In process block 702, the processor 12 may (using the systems and techniques discussed with respect to FIGS. 10-18, determine an IQ mismatch. In process block 704, the processor 12 may, via the analog compensation circuit 602, apply a compensation delay to compensate for the IQ mismatch. In process block 706, the processor 12 may determine an error in the applied compensation delay, as discussed with respect to the method 670 of FIG. 21. In process block 708, the processor 12 may adjust the compensation delay to mitigate the error in the applied compensation delay to improve the IQ mismatch compensation applied via the analog compensation circuit 602. It should be appreciated that the method 700 may be performed in the background during normal operation of the electronic device 10. In this manner, the method 700 may determine an IQ mismatch and compensate for the IQ mismatch during normal operation of the electronic device 10.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

What is claimed is:

1. A digital-to-analog converter, comprising:
a delay line comprising a plurality of inverters selectively coupled to an output of the delay line via a first plurality of switches;
an additive delay line comprising a second plurality of switches coupled to a plurality of capacitive elements, wherein the additive delay line is coupled between a first inverter and a second inverter of the plurality of inverters; and
a latch sensor comprising an input coupled to the output of the delay line and configured to transition a state of a relative signal based on a reference signal overlapping a falling edge of a first quadrature signal at the latch sensor.

2. The digital-to-analog converter of claim 1, wherein the delay line is configured to apply a first delay to the reference signal.

3. The digital-to-analog converter of claim 2, wherein each switch of the first plurality of switches is coupled between two inverters of the plurality of inverters and the output of the delay line.

4. The digital-to-analog converter of claim 3, wherein closing a first switch of the first plurality of switches applies a first adjustment to the first delay and closing a second switch of the first plurality of switches applies a second adjustment to the first delay different from the first adjustment.

5. The digital-to-analog converter of claim 2, wherein the additive delay line is configured to apply a second delay to the reference signal, wherein the second delay comprises a larger delay than the first delay.

6. The digital-to-analog converter of claim 5, wherein closing a first switch of the second plurality of switches applies a first adjustment to the second delay and closing a second switch of the second plurality of switches applies a second adjustment to the second delay.

7. The digital-to-analog converter of claim 1, wherein the latch sensor is configured to transition the state of the relative signal based on the reference signal overlapping a rising edge of the first quadrature signal at the latch sensor, wherein the relative signal is output from the latch sensor.

8. The digital-to-analog converter of claim 1, wherein the reference signal comprises a second quadrature signal.

9. The digital-to-analog converter of claim 1, comprising processing circuitry configured to determine a quadrature signal mismatch between the reference signal and the first quadrature signal based on the transition of the state of the relative signal.

10. A system, comprising:
a delay line comprising a plurality of inverters selectively coupled to an output of the delay line via a first plurality of switches, wherein the delay line is configured to apply a first delay to a reference signal; and
an additive delay line comprising a second plurality of switches coupled to a plurality of capacitive elements, wherein the additive delay line is coupled between a first inverter and a second inverter of the plurality of inverters; and
a latch sensor comprising an input coupled to the output of the delay line, the latch sensor configured to transition a state of a relative signal based on a reference signal overlapping a falling edge of a first quadrature signal at the latch sensor.

11. The system of claim 10, wherein each switch of the first plurality of switches is coupled between two inverters of the plurality of inverters and the output of the delay line, wherein the latch sensor is configured to transition a state of a relative signal based on a reference signal overlapping a rising edge of the first quadrature signal at the latch sensor, wherein the relative signal is output from the latch sensor, wherein the latch sensor is configured to transition the state of the relative signal based on the reference signal overlapping a falling edge of the first quadrature signal at the latch sensor, wherein the reference signal comprises a second quadrature signal.

12. The system of claim 10, wherein closing a first switch of the first plurality of switches applies a first adjustment to the first delay and closing a second switch of the first plurality of switches applies a second adjustment to the first delay different from the first adjustment.

13. The system of claim 10, wherein the additive delay line is configured to apply a second delay to the reference signal, wherein the second delay comprises a larger delay than the first delay.

14. The system of claim 13, wherein closing a first switch of the second plurality of switches applies a first adjustment to the second delay and closing a second switch of the second plurality of switches applies a second adjustment to the second delay.

15. A method, comprising:
applying, via a delay line, a first delay to a reference signal, the delay line comprising a plurality of inverters selectively coupled to an output of the delay line via a first plurality of switches;
applying, via an additive delay line, a second delay to the reference signal, the additive delay line comprising a second plurality of switches coupled to a plurality of capacitive elements, wherein the additive delay line is coupled between a first inverter and a second inverter of the plurality of inverters; and
transitioning, via a latch sensor, a state of a relative signal output from the latch sensor based on the reference signal overlapping a falling edge of a first quadrature signal at the latch sensor, wherein an input of the latch sensor is coupled to the output of the delay line.

16. The method of claim 15, wherein the latch sensor is configured to again transition the state of the relative signal based on the reference signal overlapping a rising edge of the first quadrature signal at the latch sensor.

17. The method of claim 16, wherein the reference signal comprises a second quadrature signal.

18. The method of claim 16, comprising determining, via processing circuitry, a quadrature signal mismatch between the reference signal and the first quadrature signal based on the transition of the state of the relative signal.

19. The digital-to-analog converter of claim 9, wherein the processing circuitry is configured to apply a compensation to the first quadrature signal to compensate for the quadrature signal mismatch by applying a delay to a rising edge of the first quadrature signal or a falling edge of the first quadrature signal.

20. The digital-to-analog converter of claim 1, wherein the relative signal comprises a readback signal output from the latch sensor based on a relationship between the reference signal and the first quadrature signal.

\* \* \* \* \*